(12) United States Patent
Muramatsu et al.

(10) Patent No.: US 9,210,805 B2
(45) Date of Patent: *Dec. 8, 2015

(54) COPPER ALLOY FOIL, FLEXIBLE PRINTED CIRCUIT BOARD USING THE SAME, AND METHOD FOR PRODUCING COPPER ALLOY FOIL

(75) Inventors: Naokuni Muramatsu, Nagoya (JP);
Hisamichi Kimura, Sendai (JP);
Akihisa Inoue, Sendai (JP)

(73) Assignees: NGK Insulators, Ltd., Nagoya (JP);
Tohoku University, Sendai-Shi (JP)

( * ) Notice: Subject to any disclaimer, the term of this patent is extended or adjusted under 35 U.S.C. 154(b) by 778 days.
This patent is subject to a terminal disclaimer.

(21) Appl. No.: 13/391,847

(22) PCT Filed: Sep. 13, 2010

(86) PCT No.: PCT/JP2010/065768
§ 371 (c)(1),
(2), (4) Date: Feb. 23, 2012

(87) PCT Pub. No.: WO2011/030899
PCT Pub. Date: Mar. 17, 2011

(65) Prior Publication Data
US 2012/0145438 A1    Jun. 14, 2012

Related U.S. Application Data

(60) Provisional application No. 61/372,185, filed on Aug. 10, 2010.

(30) Foreign Application Priority Data

Sep. 14, 2009  (JP) ................................. 2009-212052

(51) Int. Cl.
*H05K 1/09*       (2006.01)
*C22C 1/10*       (2006.01)
(Continued)

(52) U.S. Cl.
CPC .. *H05K 1/09* (2013.01); *C22C 1/10* (2013.01);
(Continued)

(58) Field of Classification Search
CPC ............... C22C 1/10; C22C 9/00; C22F 1/08;
H01B 1/026; H05K 1/09; H05K 1/0393;
H05K 2201/0355

USPC .................... 174/254; 148/554; 164/47, 66.1;
420/492
See application file for complete search history.

(56) References Cited

U.S. PATENT DOCUMENTS 4,489,136 A * 12/1984 Bose et al. .................... 428/606
5,077,005 A    12/1991 Kato
(Continued)

FOREIGN PATENT DOCUMENTS

CN      1329540 C     8/2007
EP    1 582 602 A2   10/2005
(Continued)

OTHER PUBLICATIONS

Kim et al., "High-strength Cu—Zr binary alloy with an ultrafine eutectic microstructure," J. Mater. Res., vol. 23, No. 7, Jul. 2008, 1987-1994.*
(Continued)

*Primary Examiner* — Keith Walker
*Assistant Examiner* — John Hevey
(74) *Attorney, Agent, or Firm* — Burr & Brown, PLLC

(57) ABSTRACT

The zirconium content of the alloy composition of a copper alloy foil of the present invention is 3.0 to 7.0 atomic percent, and the copper alloy foil includes copper matrix phases and composite phases composed of copper-zirconium compound phases and copper phases. As shown in FIG. 1, the copper matrix phases and the composite phases form a matrix phase-composite phase layered structure and are arranged alternately parallel to a rolling direction as viewed in a cross-section perpendicular to the width direction. In addition, the copper-zirconium compound phases and the copper phases in the composite phases form a composite phase inner layered structure and are arranged alternately parallel to the rolling direction at a phase pitch of 50 nm or less as viewed in the above cross-section. This double layered structure presumably makes the copper alloy foil densely layered to provide a strengthening mechanism similar to multilayer reinforced composite materials.

22 Claims, 32 Drawing Sheets

(51) Int. Cl.
C22C 9/00 (2006.01)
C22F 1/08 (2006.01)
H01B 1/02 (2006.01)
H05K 1/03 (2006.01)

(52) U.S. Cl.
CPC ... *C22C 9/00* (2013.01); *C22F 1/08* (2013.01); *H01B 1/026* (2013.01); *H05K 1/0393* (2013.01); *H05K 2201/0355* (2013.01)

(56) References Cited

U.S. PATENT DOCUMENTS

| | | | |
|---|---|---|---|
| 5,705,125 A * | 1/1998 | Goto et al. | 420/470 |
| 5,917,158 A * | 6/1999 | Takao et al. | 174/254 |
| 6,022,426 A | 2/2000 | Mennucci et al. | |
| 6,458,223 B1 | 10/2002 | Hans Thieme et al. | |
| 2005/0211346 A1 | 9/2005 | Kimura et al. | |

FOREIGN PATENT DOCUMENTS

| | | |
|---|---|---|
| JP | 05-138206 A1 | 6/1993 |
| JP | 2001-518681 A1 | 10/2001 |
| JP | 2005-133185 A1 | 5/2005 |
| JP | 2005-281757 A1 | 10/2005 |
| WO | 99/17307 A1 | 4/1999 |

OTHER PUBLICATIONS

Rong-de Li, et al., "*Effect of Solidification Parameters on Dendrite Arm Space and Tensile Strength of Alloy ZA27*," Materials Science & Technology, Jun. 2001, vol. 9, No. 2, pp. 199-202.

Chen-Xi Li, et al., "*Research on Secondary Dendrite Arm Spacing*," Foundry, Dec. 2004, vol. 53, No. 12, pp. 1011-1014.

Chinese Office Action (Application No. 201080037550.0) dated May 14, 2014.

T. P. Weihs, et al, "*Hardness, Ductility, and Thermal Processing of Cu/Zr and Cu/Cu—Zr Nanoscale Multilayer Foils*," ACTA Materialia, vol. 45, No. 6, Jun. 1, 1997, pp. 2307-2315.

H. Kimura et al., "*Ultrahigh Strength and High Electrical Conductivity Characteristics of Cu—Zr Alloy Wires with Nanoscale Duplex Fibrous Structure*," Materials Transactions, The Japan Inst. of Metals, vol. 47, No. 6, Jun. 15, 2006, pp. 1595-1598.

H. Kimura et al., "Effect of Cold Drawing on Electrical and Mechanical Properties of Cu-5 at% Zr Alloy," Materials Transactions, The Japan Inst. of Metals, vol. 48, No. 10, Aug. 29, 2007, pp. 2674-2678.

J.H. Swisher et al., "*Dispersion-Strengthing of Copper By Internal Oxidation of Two-Phase Copper—Zirconium Alloys*," Journal of the Institute of Metals, May 1970, vol. 98, pp. 129-133.

Extended European Search Report, corresponding EP Application No. 10815489.9, dated Jul. 19, 2013.

Extended European Search Report, related EP Application No. 10815488.1, dated Jul. 5, 2013.

Hisamichi Kimura et al., "*Mechanical Properties and Electrical Conductivity of Heavily Cold-Rolled $Cu_{100-x}Zr_x$ alloys (x=0-8)*," Materials Transactions, vol. 46, No. 7 (2005) pp. 1733-1736.

U.S. Appl. No. 13/391,139, filed Feb. 17, 2012, Muramatsu et al.

International Search Report and Written Opinion dated Dec. 7, 2010.

Final Office Action, U.S. Appl. No. 13/391,139, dated Mar. 10, 2015 (11 pages).

* cited by examiner (a) Melting step (b) Casting step (c) Rolling step

Area fraction of eutectic phase/ %

COPPER ALLOY FOIL, FLEXIBLE PRINTED CIRCUIT BOARD USING THE SAME, AND METHOD FOR PRODUCING COPPER ALLOY FOIL

BACKGROUND OF THE INVENTION

1. Technical Field

The present invention relates to copper alloy foils, flexible printed circuit boards using the foils, and methods for producing copper alloy foils.

2. Description of Related Art

Known copper alloys for foils include copper-zirconium alloys. For example, PTL 1 proposes a copper alloy foil with improved electrical conductivity and ultimate tensile strength produced by hot-rolling an alloy containing 0.01% to 0.50% by weight of zirconium and having an oxygen content of 10 ppm or less to a predetermined thickness and then repeatedly subjecting it to cold rolling with intermediate annealing to a thickness of 35 µm or less at a rolling ratio of 90% or more. This copper alloy foil achieves a high strength up to 530 MPa. In PTL 2, on the other hand, the present inventors have proposed a copper alloy containing 0.05 to 8.0 atomic percent of zirconium and having a two-phase structure in which copper matrix phases and eutectic phases of copper and a copper-zirconium compound are layered on top of each other and in which the adjacent copper matrix phase crystal grains contact intermittently, thus achieving a high strength up to 1,250 MPa.

CITATION LIST

Patent Literature

PTL 1: Japanese Unexamined Patent Application Publication No. 5-138206
PTL 2: Japanese Unexamined Patent Application Publication No. 2005-281757

SUMMARY OF INVENTION

However, the copper alloy foils disclosed in PTL 1 and 2 may have insufficient ultimate tensile strength, for example, if they are thinned, and there is therefore a need for a higher strength.

A main object of the present invention, which has been made to solve the above problem, is to provide a copper alloy foil with increased ultimate tensile strength.

As a result of an intensive study for achieving the above object, the present inventors have found that a copper alloy foil with high strength can be achieved by casting a copper alloy containing 3.0 to 7.0 atomic percent of zirconium into a plate-shaped ingot having a thickness of 3 to 10 mm using a pure copper mold and rolling the ingot to a rolling reduction of 99.00% or more, thus completing the present invention.

The present invention provides a copper alloy foil comprising: copper matrix phases; and composite phases comprising copper-zirconium compound phases and copper phases; wherein the zirconium content of alloy composition is 3.0 to 7.0 atomic percent; the copper matrix phases and the composite phases form a matrix phase-composite phase layered structure and are arranged alternately parallel to an rolling direction as viewed in a cross-section perpendicular to a width direction; and the copper-zirconium compound phases and the copper phases in the composite phases form a composite phase inner layered structure and are arranged alternately parallel to the rolling direction at a phase pitch of 50 nm or less as viewed in the cross-section.

The present invention also provides a copper alloy foil comprising: copper matrix phases; and composite phases comprising copper-zirconium compound phases and copper phases; wherein the zirconium content of alloy composition is 3.0 to 7.0 atomic percent; and the composite phases contain 5% to 25% of amorphous phases in terms of area fraction as viewed in a cross-section perpendicular to an width direction.

The present invention further provides a method for producing a copper alloy foil, comprising: (1) a melting step of melting a raw material so as to prepare a copper alloy containing 3.0 to 7.0 atomic percent of zirconium; (2) a casting step of casting the melt into an ingot having a secondary dendrite arm spacing (secondary DAS) of 10.0 µm or less; and (3) a rolling step of cold rolling the ingot to a rolling reduction of 99.00% or more.

The present invention still further provides a method for producing a copper alloy foil, comprising: (1) a melting step of melting a raw material so as to prepare a copper alloy containing 3.0 to 7.0 atomic percent of zirconium; (2) a casting step of casting the melt into a plate-shaped ingot having a thickness of 3 to 10 mm using a copper mold; and (3) a rolling step of cold rolling the ingot to a rolling reduction of 99.00% or more.

This copper alloy foil has increased ultimate tensile strength. Although the reason for this effect remains uncertain, presumably the double layered structure, namely, the matrix phase-composite phase layered structure and the composite phase inner layered structure, makes the copper alloy foil densely layered to provide a strengthening mechanism similar to the rule of mixture for fiber-reinforced composite materials or multilayer reinforced composite materials. Alternatively, presumably the amorphous phases present in the composite phases provide some strengthening mechanism.

DETAILED DESCRIPTION OF THE INVENTION

Figure 1:
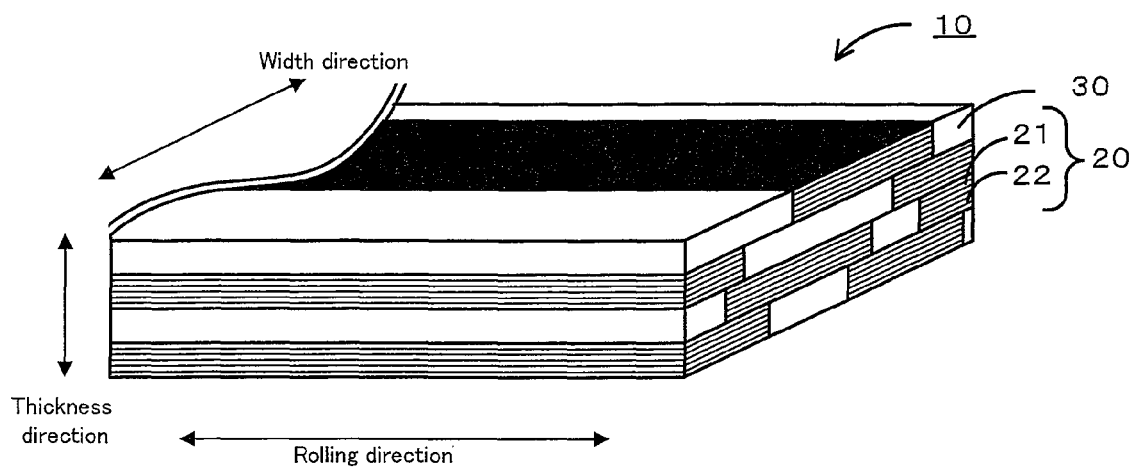
FIG. 1 is an illustration showing an example of a copper alloy foil 10 of the present invention.
Figure 2:
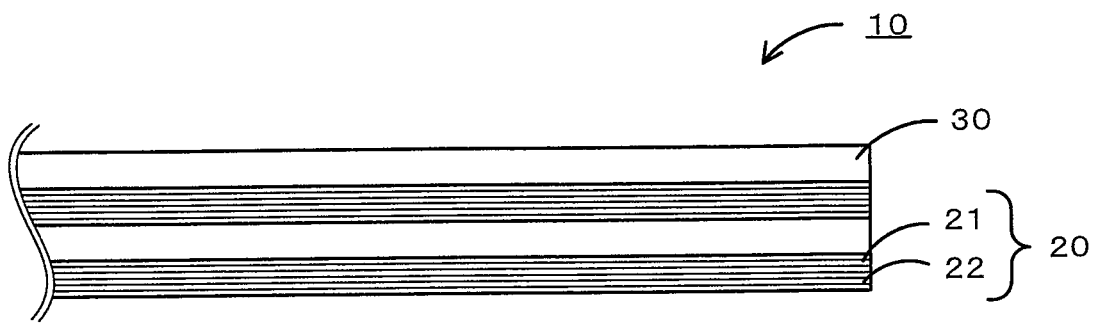
FIG. 2 is an illustration showing an example of a cross-section of the copper alloy foil 10 of the present invention perpendicular to the width direction.
Figure 3:
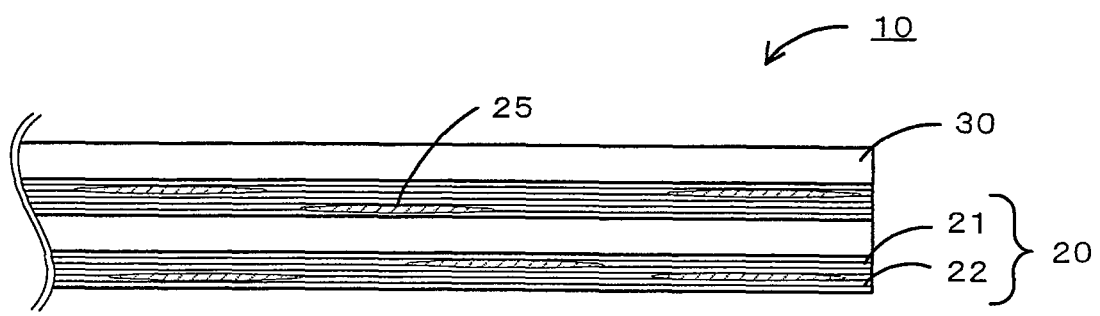
FIG. 3 is an illustration showing an example of a cross-section of the copper alloy foil 10 of the present invention perpendicular to the width direction.

A copper alloy foil of the present invention will now be described with reference to the drawings. FIG. 1 is an illustration showing an example of a copper alloy foil 10 of the present invention, and FIGS. 2 and 3 are each an illustration showing an example of a cross-section of the copper alloy foil 10 of the present invention perpendicular to the width direction. The copper alloy foil 10 of the present invention includes copper matrix phases 30 and composite phases 20 composed of copper-zirconium compound phases 22 and copper phases 21. In the copper alloy foil 10 of the present invention, the copper matrix phases 30 and the composite phases 20 form a matrix phase-composite phase layered structure and are arranged alternately parallel to the rolling direction as viewed in a cross-section perpendicular to the width direction.

The copper matrix phases 30 are formed of proeutectic copper and form the matrix phase-composite phase layered structure together with the composite phases 20. These copper matrix phases 30 increase the electrical conductivity.

The composite phases 20 are composed of the copper-zirconium compound phases 22 and the copper phases 21 and form the matrix phase-composite phase layered structure together with the copper matrix phases 30. In these composite phases 20, additionally, the copper-zirconium compound phases 22 and the copper phases 21 form a composite phase inner layered structure and are arranged alternately parallel to the rolling direction at a phase pitch of 50 nm or less as viewed in a cross-section perpendicular to the width direction. The copper-zirconium compound phases 22 are formed of a compound represented by the general formula $Cu_9Zr_2$. The phase pitch may be 50 nm or less, preferably 40 nm or less, more preferably 30 nm or less. This is because a phase pitch of 50 nm or less further increases the ultimate tensile strength. On the other hand, the phase pitch is preferably larger than 7 nm, and in view of facilitating production, more preferably 10 nm or more, further preferably 20 nm or more. The phase pitch can be determined as follows. First, a foil thinned by argon ion milling so that it can be observed in a cross-section perpendicular to the width direction is prepared as a sample for STEM observation. Next, a region where eutectic phases can be recognized in the central region, serving as a representative region, is observed at a magnification of 500,000 times or more, for example, 500,000 or 2,500,000 times, and scanning electron microscopy high-angle annular dark-field images (STEM-HAADF images) are acquired, for example, in three fields of view of 300 nm×300 nm for a magnification of 500,000 times or in ten fields of view of 50 nm×50 nm for a magnification of 2,500,000 times. Then, the widths of all copper-zirconium compound phases 22 and copper phases 21 whose widths can be examined in the STEM-HAADF images are measured, are added together, and are divided by the total number of copper-zirconium compound phases 22 and copper phases 21 whose widths were measured to calculate the average thereof as the phase pitch. Preferably, the copper-zirconium compound phases 22 and the copper phases 21 are arranged alternately at a substantially regular pitch in view of increasing the ultimate tensile strength. The term "layered" encompasses not only being continuously layered, but also being fragmentarily layered.

The composite phases 20 preferably contain 5% to 35%, more preferably 5% to 25%, of amorphous phases in terms of area fraction as viewed in a cross-section perpendicular to the width direction. That is, the area fraction of the amorphous phases in the composite phases 20 is preferably 5% to 35%, more preferably 5% to 25%. In particular, the area fraction is more preferably 10% or more, further preferably 15% or more. This is because an area fraction of the amorphous phases of 5% or more further increases the ultimate tensile strength. On the other hand, a copper alloy foil containing 35% or more of amorphous phases is difficult to produce. As shown in FIG. 3, amorphous phases 25 are mainly formed at the interfaces between the copper-zirconium compound phases 22 and the copper phases 21, presumably contributing to maintaining sufficient ultimate tensile strength. The area fraction of the amorphous phases can be determined as follows. First, a foil thinned by argon ion milling so that it can be observed in a cross-section perpendicular to the width direction is prepared as a sample for STEM observation. Next, a region where eutectic phases can be recognized in the central region, serving as a representative region, is observed at a magnification of 500,000 times or more, for example, 500,000 or 2,500,000 times, and lattice images are acquired, for example, in three fields of view of 300 nm×300 nm for a magnification of 500,000 times or in ten fields of view of 50 nm×50 nm for a magnification of 2,500,000 times. Then, the area fractions of possible amorphous regions where atoms are randomly arranged in the acquired STEM lattice images are measured, and the average thereof is calculated as the area fraction of the amorphous phases (hereinafter also referred to as "amorphous fraction").

The composite phases preferably occupy 40% to 60%, more preferably 45% to 60%, and further preferably 50% to 60%, of the copper alloy foil 10 of the present invention in terms of area fraction as observed in a cross-section perpendicular to the width direction. This is because an area fraction of 40% or more further increases the strength, whereas an area fraction of 60% or less, at which the amount of composite phases is not excessive, prevents a possible break from the hard copper-zirconium compound during rolling. The area fraction of the composite phases presumably does not exceed 60% within the composition range of the present invention. In addition, if the copper alloy foil is used as a conductive foil, the area fraction of the composite phases 20 is preferably 40% to 50%. This is because an area fraction of the composite phases 20 of 40% to 50% further increases the electrical conductivity, where presumably the copper matrix phases 30 serve as a free electron conductor to maintain sufficient electrical conductivity, whereas the composite phases 20, containing the copper-zirconium compound, maintain sufficient mechanical strength. As used herein, the term "electrical conductivity" refers to the electrical conductivity represented as a proportion relative to the electrical conductivity of annealed pure copper, which is defined as 100%, and is expressed in % IACS (the same applied hereinafter). The area fraction of the composite phases 20 can be determined as follows. First, a rolled copper alloy foil is observed by SEM in a cross-section perpendicular to the width direction. Next, the black-and-white contrast of composite phases (white regions) and copper matrix phases (black regions) is binarized to determine the fraction of the composite phases in the entire cross-section. The resultant value is used as the area fraction of the composite phases (hereinafter also referred to as "composite phase fraction").

Figure 4:
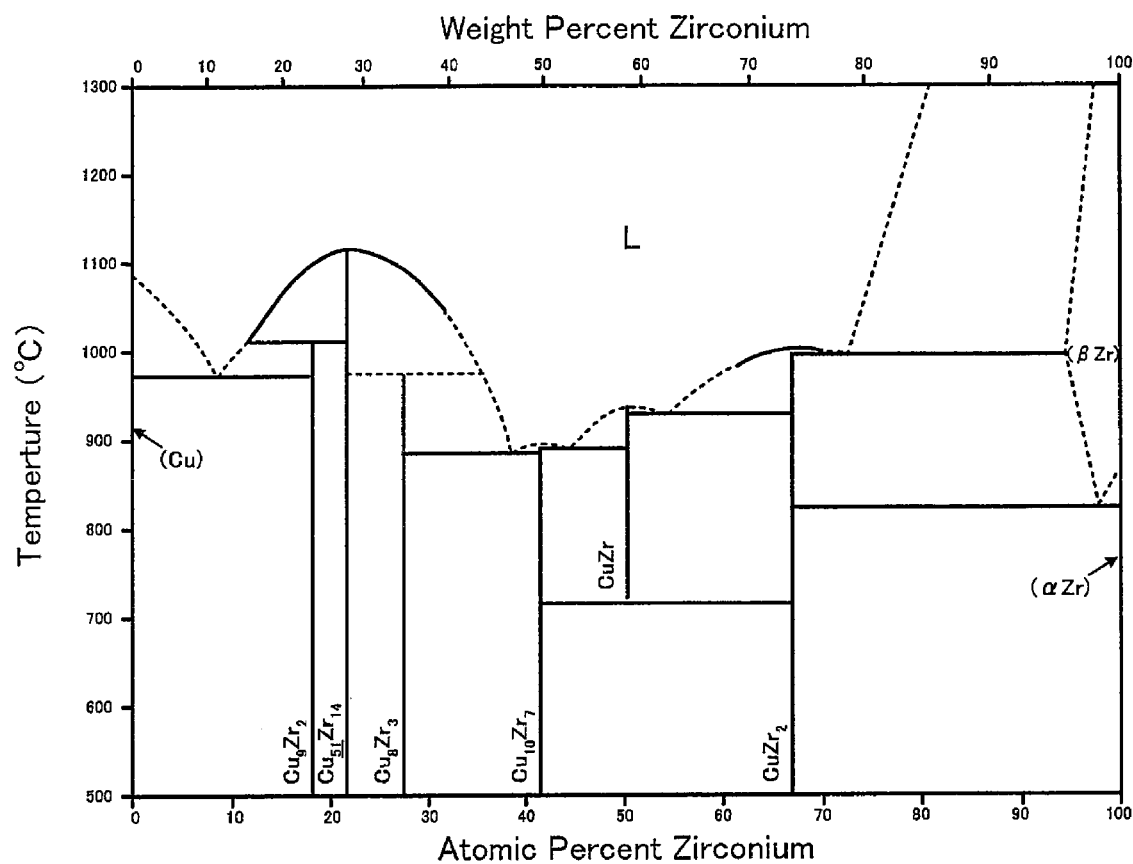
FIG. 4 is an equilibrium diagram of copper-zirconium binary alloy.

The zirconium content of the alloy composition of the copper alloy foil 10 of the present invention is 3.0 to 7.0 atomic percent. Although the balance may include elements other than copper, the balance is preferably copper and incidental impurities, and the amount of incidental impurities is preferably as small as possible. Specifically, the copper alloy is preferably a copper-zirconium binary alloy represented by the composition formula $Cu_{100-x}Zr_x$, wherein x is 3.0 to 7.0. The zirconium content may be 3.0 to 7.0 atomic percent, preferably 4.0 to 6.8 atomic percent, more preferably 5.0 to 6.8 atomic percent. FIG. 4 is an equilibrium diagram of copper-zirconium binary alloy. According to this diagram, presumably the composition of the copper alloy foil of the present invention is a hypoeutectic composition of copper and $Cu_9Zr_2$, and the composite phases 20 are eutectic phases of copper and $Cu_9Zr_2$. A zirconium content of 3.0 atomic percent or more further increases the ultimate tensile strength because the amount of eutectic phases is not too small. On the other hand, a zirconium content of 7.0 atomic percent or less prevents, for example, a possible break from hard $Cu_9Zr_2$ during rolling because the amount of eutectic phases is not too large. In particular, a binary alloy composition represented by the composition formula $Cu_{100-x}Zr_x$ is preferred in that an appropriate amount of eutectic phases can be more easily formed. In addition, a binary alloy composition is preferred in that it facilitates management for reuse of scrap materials, other than products, produced during manufacture and scrap parts scrapped after their useful lives, as remelted materials.

The copper alloy foil 10 of the present invention has an ultimate tensile strength in the rolling direction of 1,300 MPa or more and an electrical conductivity of 20% IACS or more. In addition, the ultimate tensile strength can be increased to 1,500 MPa or more, or to 1,700 MPa or more, depending on the alloy composition and the structure control. For example, a higher ultimate tensile strength can be achieved by increasing the zirconium content (atomic percent), increasing the eutectic phase fraction, reducing the phase pitch, or increasing the amorphous fraction. The reason for such a high ultimate tensile strength is presumably that the double layered structure, namely, the matrix phase-composite phase layered structure and the composite phase inner layered structure, makes the copper alloy foil 10 densely layered to provide a strengthening mechanism similar to the rule of mixture for fiber-reinforced composite materials or multilayer reinforced composite materials.

The copper alloy foil 10 of the present invention preferably has a thickness of 0.050 mm or less. In particular, the thickness is more preferably 0.025 mm or less, further preferably 0.010 mm or less. The present invention is highly significant to apply to such extremely thin foils because they often result in low production yield due to, for example, a break during rolling because of their insufficient ultimate tensile strength as elemental plates. On the other hand, the thickness is preferably larger than 0.003 mm, and in view of facilitating working, more preferably 0.005 mm or more, further preferably 0.008 mm or more.

The copper alloy foil 10 of the present invention can be used as a high-strength, ultrathin rolled copper alloy foil having electrical conductivity for constructing an electrical component mounted on a compact electronic device. For example, the copper alloy foil 10 can be used for flexible printed circuit boards (FPCs) for use in cellular phones. A flexible printed circuit board including the copper alloy foil 10 of the present invention will now be described.

The flexible printed circuit board of the present invention includes the copper alloy foil 10 as a conductive foil. The flexible printed circuit board may include, for example, the copper alloy foil 10, serving as a conductive foil, a base film, and an adhesive layer for bonding the copper alloy foil and the base film. The thickness of the copper alloy foil 10 is preferably, but not limited to, 0.050 mm or less, more preferably 0.025 mm or less, and further preferably 0.010 mm or less. For example, a smaller bending radius and a longer bending life are required for FPCs for thin cellular phones that frequently experience large sliding motion. In this case, the bending radius of the conductor can be decreased by decreasing the thickness thereof, and the bending life can be increased by increasing the strength thereof. The thickness is preferably 0.003 mm or more, and in view of facilitating working, 0.005 mm or more, further preferably 0.008 mm or more. The base film may be, for example, but not limited to, polyimide (PI), polyethylene terephthalate (PET), polyether nitrile (PEN), polytetrafluoroethylene (PTFE), liquid crystal polymer (LCP), epoxy, and aramid. The base film preferably has a thickness of 0.050 mm or less, more preferably 0.030 mm or less, and further preferably 0.020 mm or less. This is because a thickness of 0.050 mm or less allows a reduction in the thickness of flexible printed circuit board. On the other hand, the base film may have a thickness of 0.005 mm or more and is preferably 0.010 mm or more, more preferably 0.015 mm or more, in view of ensuring sufficient strength and insulation properties of flexible printed circuit boards. The adhesive layer may be, for example, acrylic, epoxy, PI, PET, or phenol butyral.

Figure 5:
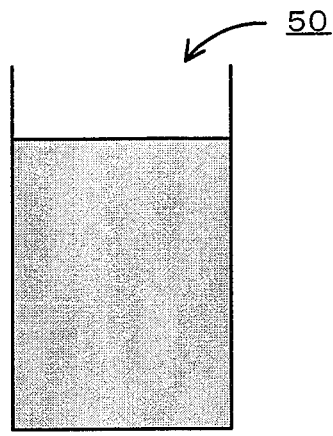
FIG. 5 is a set of illustrations schematically showing a copper alloy in the individual steps of a method for producing the copper alloy foil of the present invention.
Figure 5:
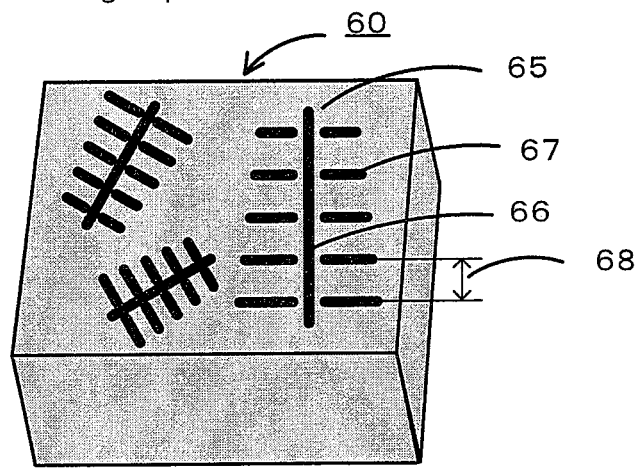
Figure 5:
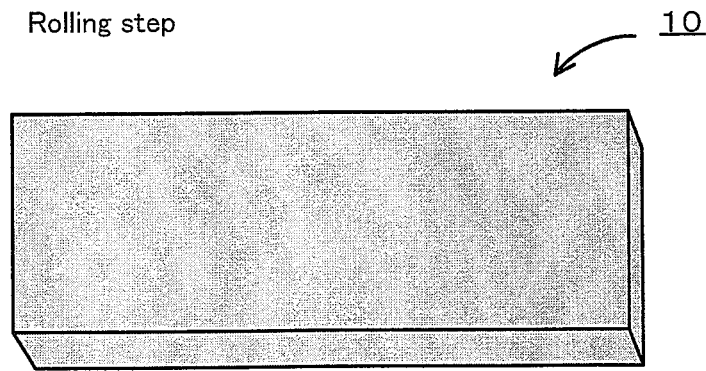

Next, a method for producing the copper alloy foil 10 will be described. The method for producing the copper alloy foil of the present invention may include (1) a melting step of melting a raw material, (2) a casting step of casting the melt into an ingot, and (3) a rolling step of cold-rolling the ingot. The individual steps will now be sequentially described. FIG. 5 is a set of illustrations schematically showing a copper alloy in the individual steps of the method for producing the copper alloy foil of the present invention. FIG. 5(a) is an illustration showing a melt 50 melted in the melting step, FIG. 5(b) is an illustration showing an ingot 60 formed in the casting step, and FIG. 5(c) is an illustration showing the copper alloy foil 10 formed in the rolling step.

(1) Melting Step

In the melting step, as shown in FIG. 5(a), a process for preparing the melt 50 by melting the raw material is carried out. The raw material used may be any material from which a copper alloy containing 3.0 to 7.0 atomic percent of zirconium can be prepared and may be either an alloy or a pure metal. A copper alloy containing 3.0 to 7.0 atomic percent of zirconium is suitable for cold working. In addition, this copper alloy is preferred in that it has good melt flow because it has low melt viscosity due to its alloy composition close to the eutectic composition. Preferably, the raw material contains no element other than copper and zirconium. In this case, an appropriate amount of eutectic phases can be more readily formed. The melting process may be, for example, but not limited to, a common process such as high-frequency induction melting, low-frequency induction melting, arc melting, or electron beam melting, or may be levitation melting. Of these, high-frequency induction melting and levitation melting are preferably used. High-frequency induction melting is preferred in that it allows melting in high volume at one time, whereas levitation melting, in which molten metal is levitated during melting, is preferred in that it more effectively inhibits molten metal from being contaminated with impurities from, for example, crucibles. The melting atmosphere is preferably a vacuum atmosphere or an inert atmosphere. The inert atmosphere may be any gas atmosphere that does not affect the alloy composition, for example, a nitrogen atmosphere, a helium atmosphere, or an argon atmosphere.

(2) Casting Step

In this step, a process for casting the melt 50 by pouring it into a mold is carried out. As shown in FIG. 5(b), the ingot 60 has a dendritic structure including a plurality of dendrites 65. The dendrites 65 are formed only of proeutectic copper phases and each include a primary dendrite arm 66 serving as a trunk and a plurality of secondary dendrite arms 67 serving as branches extending from the primary dendrite arm 66. The secondary dendrite arms 67 extend from the primary dendrite arm 66 substantially perpendicularly.

In the producing method of the present invention, the melt 50 is cast into an ingot having a secondary dendrite arm spacing (secondary DAS) of 10.0 μm or less. The secondary DAS may be 10.0 μm or less, preferably 9.4 μm or less, more preferably 4.1 μm or less. If the secondary DAS is 10.0 μm or less, the copper matrix phases 30 and the composite phases 20 form a dense layered structure extending in one direction in the subsequent rolling step, thus further increasing the ultimate tensile strength. On the other hand, the secondary DAS is preferably larger than 1.0 μm, more preferably 1.6 μm or more, in view of ingot casting. The secondary DAS can be determined as follows. First, three dendrites 65 having a series of four or more secondary dendrite arms 67 are selected in a cross-section perpendicular to the plate surface of the ingot 60. Next, each spacing 68 between the series of four secondary dendrite arms 67 of each dendrite 65 is measured. Then, the average of a total of nine spacings 68 is calculated as the secondary DAS.

The casting process may be, for example, but not limited to, permanent mold casting, low-pressure casting, twin-roll casting, or mold-clamping casting, or may be a die casting process such as normal die casting, squeeze casting, or vacuum die casting. Continuous casting can also be employed. The mold used for casting is preferably one having high thermal conductivity, for example, a copper mold. The use of a copper mold, which has high thermal conductivity, accelerates the cooling rate during casting, thus further reducing the secondary DAS. The copper mold used is preferably a pure copper mold, although it may be any copper mold having a thermal conductivity similar to that of a pure copper mold (for example, about 350 to 450 W/(m·K) at 25° C.). Although the structure of the mold is not particularly limited, a water-cooled pipe may be installed inside the mold to adjust the cooling rate. In addition, for example, if the melt 50 is cast into a plate-shaped ingot, it is possible to use a mold having a large inlet such that one of the surfaces of the ingot does not contact the mold or to use a mold having a small inlet such that part of the side surfaces of the ingot does not contact the mold. The shape of the resultant ingot 60 is preferably, but not limited to, a thin plate shape. This accelerates the cooling rate, thus forming a more uniform casting structure. In particular, a rectangular plate shape is preferred. This is because it facilitates the subsequent rolling process. Whereas the casting process for forming the ingot 60 has been described above, it is particularly suitable to form a plate-shaped ingot having a thickness of 3 to 10 mm by casting using a copper mold. This is because a thickness of 3 mm or more allows a better melt flow, whereas a thickness of 10 mm or less further reduces the secondary DAS. The pouring temperature is preferably 1,100° C. to 1,300° C., more preferably 1,150° C. to 1,250° C. This is because a pouring temperature of 1,100° C. or more allows a good melt flow, whereas a pouring temperature of 1,300° C. or less causes little deterioration of the mold.

(3) Rolling Step

Figure 7:
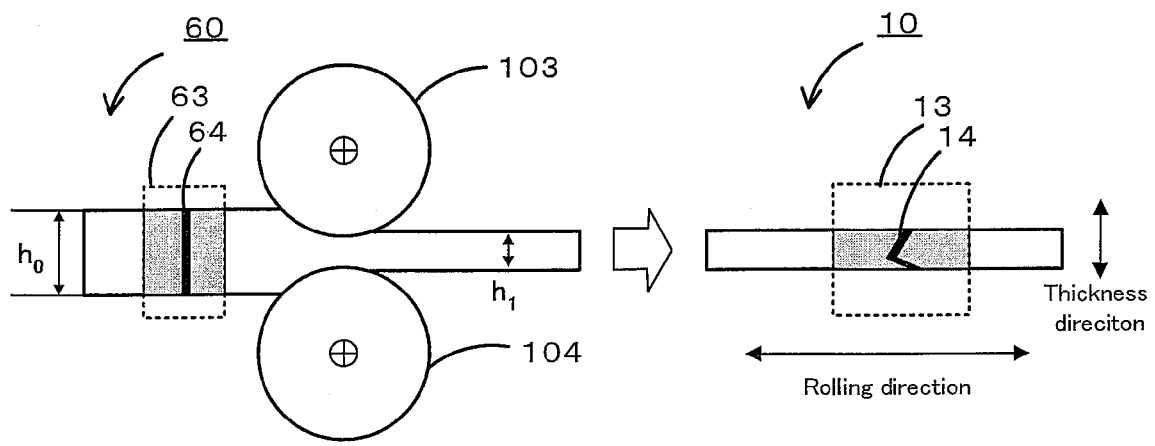
FIG. 7 is a schematic diagram showing an example of compression rolling.
Figure 8:
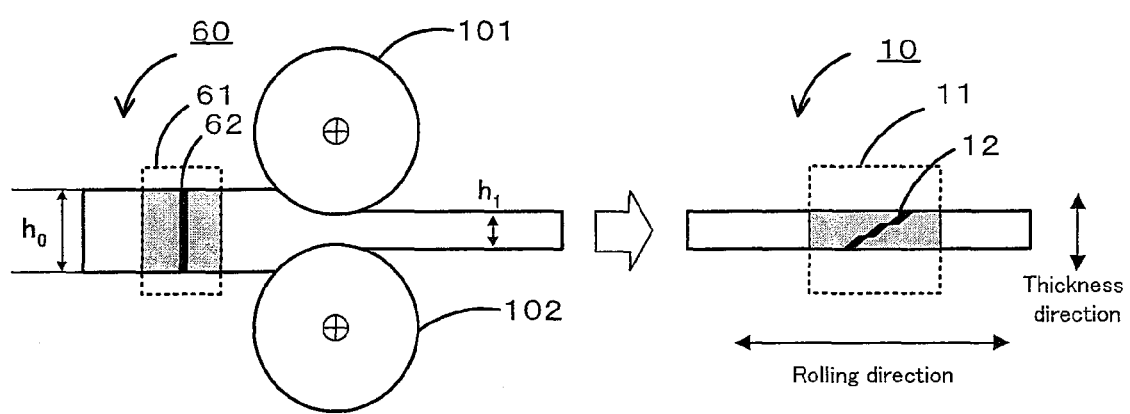
FIG. 8 is a schematic diagram showing an example of shear rolling.

In this step, a process for forming the copper alloy foil 10 shown in FIG. 5(c) and 1 by rolling the ingot 60 is carried out. In this step, the ingot 60 is cold-rolled to a rolling reduction of 99.00% or more. As used herein, the term "cold" refers to working at room temperature without heating. Thus, cold rolling presumably inhibits recrystallization, thus making it possible to easily provide a copper alloy foil 10 densely layered with the double layered structure, namely, the matrix phase-composite phase layered structure and the composite phase inner layered structure. In addition, cold rolling simplifies the production process for increased productivity because the copper alloy foil 10 can be produced only by cold rolling without the need for annealing during the working of the ingot 60 into the copper alloy foil 10 or aging after the working. The rolling process may be, for example, but not limited to, a rolling process using at least one pair of upper and lower rollers. Examples of such rolling processes include compression rolling and shear rolling, which may be used alone or in combination. As used herein, the term "compression rolling" refers to rolling intended to cause compressive deformation by applying a compressive force to the work being rolled. On the other hand, the term "shear rolling" refers to rolling intended to cause shear deformation by applying a shear force to the work being rolled. FIG. 7 is a schematic diagram showing an example of compression rolling, and FIG. 8 is a schematic diagram showing an example of shear rolling. In the compression rolling shown in FIG. 7, the plate-shaped ingot 60 formed by casting is cold-rolled by passing it between rotating upper and lower rollers 103 and 104. The ingot 60, which has a thickness h0 before the rolling, is thinned to a thickness h1 after the rolling. A portion 63 of the ingot 60 before the rolling is thinned into a portion 13 of the copper alloy foil 10 by compression rolling. During this process, an extremely small element 64 in a rectangular region longer in the thickness direction as observed in a cross-section perpendicular to the width direction becomes an extremely small element 14 bent near the center of the thickness after the compression rolling. The compressive deformation is caused by compression rolling such that the coefficient of friction between the surfaces of the upper roller 105 and the ingot 60 in contact with each other and the coefficient of friction between the surfaces of the lower roller 106 and the ingot 60 in contact with each other are both minimized. For example, the coefficient of friction between the upper roller and the ingot is preferably 0.01 to 0.05, the coefficient of friction between the lower roller and the ingot is preferably 0.01 to 0.05, and the difference in coefficient of friction between the upper and lower roller sides is preferably 0 to 0.02. For cold rolling, rolling accuracy is often given priority; compression rolling is often used because uniform compressive deformation can be more readily caused. In the shear rolling shown in FIG. 8, on the other hand, the plate-shaped ingot 60 formed by casting is cold-rolled by passing it between rotating upper and lower rollers 101 and 102. The ingot 60, which has a thickness h0 before the rolling, is thinned to a thickness h1 after the rolling. A portion 61 of the ingot 60 before the rolling is thinned into a portion 11 of the copper alloy foil 10 by shear rolling. During this process, an extremely small element 62 in a rectangular region longer in the thickness direction as observed in a cross-section perpendicular to the width direction is inclined in substantially one direction by shear slip deformation without being bent near the center of the thickness, becoming an extremely small element 12 longer in the rolling direction than the extremely small element 14. This shear slip deformation forms a densely layered structure. Shear rolling is performed by providing a difference in friction state between the surfaces of the upper roller 101 and the ingot 60 in contact with each other and the surfaces of the lower roller 102 and the ingot 60 in contact with each other. Examples of processes that provide different friction states include asymmetric rolling, in which a pair of upper and lower rollers rotate at different speeds, and a process in which an ingot is rolled such that the interfaces between the pair of rollers and the ingot have different coefficients of friction. As the friction state, for example, the coefficient of friction between the upper roller and the ingot is preferably 0.1 to 0.5, the coefficient of friction between the lower roller and the ingot is preferably 0.01 to 0.2, and the difference in coefficient of friction between the upper and lower roller sides is preferably 0.15 to 0.5. With the drive torque G (Nm) applied to the rolling rollers, the radius R (m) of the rollers, and the rolling load P (N), the coefficient of friction μ can be represented by $\mu = G/RP$. The upper rollers 101 and 103 and the lower rollers 102 and 104 may be any rollers that provide the intended friction state, and the material and shape of the rollers are not particularly limited. For example, rollers for forming a smooth foil or rollers for forming a foil having a special cross-section such as an irregular cross-section or a tapered cross-section may be used. The rolling pass conditions may be empirically determined. For example, the ingot 60 may be repeatedly rolled multiple times so that the rolling reduction is 99.00% or more. In this case, a break is less likely to occur during the rolling. More preferably, the rolling passes include shear rolling because it allows a densely layered structure rolled in the rolling direction to be more readily formed over the entire thickness and is more suitable for rolling to high rolling ratio. This is because presumably a densely layered structure can be more readily formed by performing shear rolling so as to apply a shear force parallel to the rolling direction to a cross-section perpendicular to the thickness direction. The rolling reduction may be 99.00% or more, preferably 99.50% or more, more preferably 99.80% or more. This is because a higher rolling reduction further increases the ultimate tensile strength. Although the reason for this remains uncertain, the ultimate tensile strength increases with increasing rolling ratio presumably because the crystal structure is distorted as the composite phases 20 change their crystal structure to occupy a larger area as viewed in cross-section, or as the copper matrix phases 30 deform preferentially to occupy a smaller area as viewed in cross-section. Another possible cause is that copper and $Cu_9Zr_2$, which are thought to form an fcc structure, become partially amorphous after heavy working. The present inventors have carried out rolling of ingots produced under the same conditions at varying rolling reductions and have demonstrated that the volume of the composite phases 20 increases with increasing rolling reduction. The rolling reduction may be less than 100.00%, preferably 99.99% or less in view of working. The rolling reduction (%) is determined by calculating {(thickness before rolling−thickness after rolling)×100}/(thickness before rolling). The rolling speed is preferably, but not limited to, 1 to 100 m/min, more preferably 5 to 20 m/min. This is because a rolling speed of 5 m/min or more allows efficient rolling, whereas a rolling speed of 20 m/min or less more reliably prevents, for example, a break during the rolling.

In the rolling step, the ingot 60 is preferably rolled to a thickness of 0.050 mm or less, more preferably 0.025 mm or less, and further preferably 0.010 mm or less. The present invention is highly significant to apply to such extremely thin foils because they often result in low production yield due to, for example, a break during rolling because of their insufficient ultimate tensile strength as elemental plates. On the other hand, the thickness is preferably larger than 0.003 mm, and in view of facilitating working, more preferably 0.005 mm or more, further preferably 0.008 mm or more.

In this rolling step, the copper alloy foil 10 is formed. This copper alloy foil 10 includes the composite phases 20 composed of the copper-zirconium compound phases 22 and the copper phases 21 and the copper matrix phases 30. As shown in FIG. 2, the copper matrix phases 30 and the composite phases 20 form a matrix phase-composite phase layered structure and are arranged alternately parallel to the rolling direction as viewed in a cross-section perpendicular to the width direction. In the composite phases 20, additionally, the copper-zirconium compound phases 22 and the copper phases 21 form a composite phase inner layered structure and are arranged alternately parallel to the rolling direction at a phase pitch of 50 nm or less as viewed in a cross-section perpendicular to the width direction. Thus, presumably the double layered structure, namely, the matrix phase-composite phase layered structure and the composite phase inner layered structure, makes the copper alloy foil 10 densely layered to provide a strengthening mechanism similar to the rule of mixture for fiber-reinforced composite materials or multi-layer reinforced composite materials.

The present invention is not limited to the embodiment described above; it can be practiced in various manners within the technical scope thereof.

For example, in the embodiment described above, the copper alloy foil 10 has the matrix phase-composite phase layered structure and the composite phase inner layered structure and, in the composite phase inner layered structure, the copper-zirconium compound phases 22 and the copper phases 21 are arranged alternately parallel to the rolling direction at a phase pitch of 50 nm or less as viewed in a cross-section perpendicular to the width direction; instead, the copper alloy foil 10 may include copper matrix phases and composite phases composed of copper-zirconium compound phases and copper phases, the zirconium content of the alloy composition may be 3.0 to 7.0 atomic percent, and the composite phases may contain 5% to 25% of amorphous phases in terms of area fraction as viewed in a cross-section perpendicular to the width direction. This is because an area fraction of amorphous phases of 5% to 25% provides high ultimate tensile strength. More preferably, in the above composite phases, the copper-zirconium compound phases and the copper phases form a composite phase inner layered structure and are arranged alternately parallel to the rolling direction as viewed in a cross-section perpendicular to the width direction. This further increases the ultimate tensile strength.

Whereas the method for producing the copper alloy foil 10 according to the embodiment described above includes the casting step of casting the melt 50 into an ingot having a secondary DAS of 10.0 μm or less, it may instead include a casting step of casting the melt 50 into a plate-shaped ingot having a thickness of 3 to 10 mm using a pure copper mold. This provides a copper alloy foil 10 having high ultimate tensile strength.

Whereas the method for producing the copper alloy foil 10 according to the embodiment described above includes the melting step, the casting step, and the rolling step, it may include other steps. For example, a holding step, that is, a step of holding the melt, may be included between the melting step and the casting step. If the holding step is included, melting can be started in the melting furnace immediately after transferring the melt to a holding furnace without waiting for all the melt melted in the melting step to be completely cast, thus further increasing the utilization of the melting furnace. In addition, if component adjustment is performed in the holding step, finer adjustment can be more readily performed. In addition, a cooling step of cooling the ingot may be included between the casting step and the rolling step. This reduces the time from casting to rolling.

Whereas the melting, casting, and rolling steps of the method for producing the copper alloy foil 10 according to the embodiment described above are described as separate steps, the individual steps may be continuous without clear boundaries therebetween, as in continuous casting and rolling, which is employed as an integrated process of producing, for example, copper foils. This allows more efficient production of the copper alloy foil 10.

The above description of the copper alloy foil and the method for producing the copper alloy foil of the present invention is directed to alloy compositions containing 3.0 to 7.0 atomic percent of zirconium, with the balance being copper, and containing as small amounts of other elements as possible (hereinafter also referred to as "other-element-free materials"). As a result of a further study, the present inventors have found that alloy compositions containing components other than copper and zirconium (hereinafter also referred to as "other-element-containing materials") provide higher strength. Preferred embodiments of other-element-containing materials will now be described. Because the basic composition and method for production are common to other-element-free materials and other-element-containing materials, the above description of other-element-free materials applies to other-element-containing materials for common details; therefore, a description thereof will be omitted.

In the copper alloy foil of the present invention, the copper matrix phases may be further divided into a plurality of copper phases in layered form. That is, the copper matrix phases 30 may be composed of a plurality of copper phases forming a copper matrix phase inner layered structure and arranged alternately parallel to the rolling direction as viewed in a cross-section perpendicular to the width direction. In this case, the average width of the plurality of copper phases is preferably 150 nm or less, more preferably 100 nm or less, and further preferably 50 nm or less. Thus, if a copper matrix phase inner layered structure is formed in the copper matrix phases 30, presumably the ultimate tensile strength can be further increased by the effect similar to the Hall-Petch law, which states that the ultimate tensile strength increases as the grain size becomes smaller. At the same time, the copper matrix phases preferably contain deformation twins. Thus, if the copper matrix phases contain deformation twins, presumably the ultimate tensile strength can be increased as a result of twinning without significantly decreasing the electrical conductivity. The deformation twins are preferably present at an angle of 20° to 40° with reference to the rolling direction so as not to straddle the boundaries between the adjacent copper phases as viewed in a cross-section perpendicular to the width direction. In addition, the copper matrix phases preferably contain 0.1% to 5% of deformation twins. In addition, it is preferable that almost no dislocations be found in the α-copper phases and the copper-zirconium compound phases, at least in a cross-section perpendicular to the width direction. In particular, presumably the electrical conductivity can be further increased if the α-copper phases, which are good conductors, have fewer dislocations. For other-element-free materials, the copper matrix phases may be divided into a plurality of copper phases, may contain deformation twins, and may have fewer dislocations. In such cases, presumably the ultimate tensile strength or the electrical conductivity can be further increased.

In the copper alloy foil of the present invention, the average width of the copper-zirconium compound phases as viewed in a cross-section perpendicular to the width direction is preferably 20 nm or less, more preferably 10 nm or less, further preferably 9 nm or less, and most preferably 7 nm or less. If the average width is 20 nm or less, presumably the ultimate tensile strength can be further increased. In addition, the copper-zirconium compound phases are preferably represented by the general formula $Cu_9Zr_2$ and are more preferably amorphous phases in part or the entirety thereof. This is because presumably amorphous phases are readily formed in the $Cu_9Zr_2$ phases. For other-element-free materials, presumably the ultimate tensile strength can be further increased if the average width of the copper-zirconium compound phases is 20 nm or less. For other-element-free materials, additionally, the $Cu_9Zr_2$ phases may be amorphous phases in part or the entirety thereof.

The copper alloy foil of the present invention may contain elements other than copper and zirconium. For example, the copper alloy foil may contain elements such as oxygen, silicon, and aluminum. In particular, the copper alloy foil preferably contains oxygen because it makes the copper alloy, particularly the $Cu_9Zr_2$ phases, more amorphous for the unknown reason. In particular, the copper alloy becomes more amorphous with increasing rolling ratio. The amount of oxygen in the raw material composition is preferably, but not limited to, 700 to 2,000 ppm by mass. In addition, oxygen is preferably contained in the copper alloy foil, particularly, in the copper-zirconium compound phases. Similarly, if silicon and aluminum are contained, they are preferably contained in the copper-zirconium compound. In this case, the mean atomic number Z of the copper-zirconium compound phases calculated from the elemental composition determined by quantitative measurement of the O—K line, the Si—K line, the Cu—K line, and the Zr-L line using the ZAF method based on EDX analysis is preferably 20 to less than 29. More preferably; the mean atomic number $Z_A$ of the copper-zirconium compound phases calculated from the elemental composition determined by quantitative measurement of the O—K line, the Si—K line, the Al—K line, the Cu—K line, and the Zr-L line using the ZAF method based on EDX analysis is 20 to less than 29. If the mean atomic number Z is 20 or more, presumably the amounts of oxygen and silicon are not excessive, so that the ultimate tensile strength and the electrical conductivity can be further increased. On the other hand, if the mean atomic number Z is less than 29, that is, less than the atomic number of copper, presumably the proportion of oxygen and silicon and the proportion of copper and zirconium are well-balanced, so that the ultimate tensile strength and the electrical conductivity can be increased. In addition, the proportion of zirconium in the copper alloy foil is preferably 3.0 to 6.0 atomic percent. At the same time, the copper matrix phases preferably contain no oxygen. As used herein, the phrase "contain no oxygen" refers to, for example, containing an amount of oxygen that is undetectable in the above quantitative measurement using the ZAF method based on EDX analysis. The mean atomic number Z can be determined as the sum of the atomic number of oxygen, 8, the atomic number of silicon, 14, the atomic number of copper, 29, and the atomic number of zirconium, 40, multiplied by the respective elemental concentrations (in atomic percent) and divided by 100.

The copper alloy foil of the present invention has an ultimate tensile strength in the rolling direction of 1,300 MPa or more and an electrical conductivity of 15% IACS or more. Furthermore, the ultimate tensile strength can be increased to, for example, 1,500 MPa or more, 1,700 MPa or more, or 2,200 MPa or more, depending on the alloy composition and the structure control. In addition, the electrical conductivity in the rolling direction can be increased to, for example, 16% IACS or more, or 20% IACS or more, depending on the alloy composition and the structure control. In addition, the Young's modulus in the rolling direction can be varied depending on the alloy composition and the structure control. For example, the Young's modulus in the rolling direction can be characteristically decreased to 60 to 90 GPa, which is nearly half those of typical copper alloys as disclosed in PTLs 1 and 2. For other-element-free materials, presumably the Young's modulus can be decreased to, for example, 60 to 90 GPa by controlling, for example, the proportion of the amorphous phases.

Next, the production method will be described. In the method for producing the copper alloy foil of the present invention, the raw material used in the melting step may be a material containing at least oxygen in addition to copper and zirconium. The amount of oxygen is preferably 700 to 2,000 ppm by mass, more preferably 800 to 1,500 ppm by mass. A material containing oxygen is preferred because it makes the copper alloy, particularly the $Cu_9Zr_2$ phases, more amorphous for the unknown reason. The vessel used for melting the raw material is preferably a crucible. In addition, the vessel used for melting the raw material is preferably, but not limited to, a vessel containing silicon or aluminum, more preferably a vessel containing quartz ($SiO_2$) or alumina ($Al_2O_3$). For example, a quartz or alumina vessel can be used. Of these, if a quartz vessel is used, silicon may intrude into the alloy and, particularly, intrudes easily into the composite phases, more particularly the $Cu_9Zr_2$ phases. The vessel preferably has a tap hole in the bottom surface thereof. This allows the melt to be poured through the tap hole in the subsequent casting step while continuing injection of an inert gas, thus more readily allowing oxygen to remain in the alloy. In addition, the melting atmosphere is preferably an inert gas atmosphere, and particularly, the raw material is preferably melted while injecting an inert gas so as to apply pressure to the surface of the alloy. This presumably allows the oxygen contained in the raw material to remain in the alloy, thus making it more amorphous. The pressure of the inert gas is preferably 0.5 to 2.0 MPa.

In the method for producing the copper alloy foil of the present invention, the inert gas atmosphere is preferably maintained in the casting step continuously after the melting step so as to apply pressure to the surface of the alloy. In this case, the inert gas is preferably injected so as to apply a pressure of 0.5 to 2.0 MPa to the raw material. In addition, the melt is preferably poured through the tap hole in the bottom surface of the crucible while injecting the inert gas. This allows the melt to be poured without contact with outside air (atmospheric air). In the casting step, the melt is preferably solidified by quenching so that, according to results of an analysis by the EDX-ZAF method, the amount of zirconium contained in the copper matrix phases of the ingot at room temperature after the solidification is supersaturated at 0.3 atomic percent or more. This is because such solidification by quenching further increases the ultimate tensile strength. In the copper-zirconium equilibrium diagram, the solid solubility limit of zirconium is 0.12%. Although the mold used in the casting step is not particularly limited, the metal melted in the melting step is preferably poured into a copper mold or a carbon mold such as a carbon mill roll because they allow the melt to be more readily quenched. For production of other-element-free materials, it is presumably preferable to solidify the melt by quenching so that, according to results of an analysis by the EDX-ZAF method, the amount of zirconium is supersaturated at 0.3 atomic percent or more. For production of other-element-free materials, additionally, the metal melted in the melting step may be poured into a copper mold or a carbon mold.

In the method for producing the copper alloy foil of the present invention, the ingot is preferably cold-rolled to a reduction of area of 99.00% or more through one or more rolling passes in the rolling. Preferably, at least one of the rolling passes has a reduction of area of 15% or more. This presumably further increases the ultimate tensile strength. In the rolling step, additionally, the temperature for cold rolling is preferably lower than room temperature (for example, 30° C.), more preferably 25° C. or less, and further preferably 20° C. or less. This presumably allows deformation twins to occur more readily, thus further increasing the ultimate tensile strength. The temperature can be controlled by, for example, cooling at least one of the material and the equipment for rolling (such as a mill roll) to a temperature lower than room temperature before use. Examples of methods for cooling the material or the equipment include immersing the material or the equipment in a bath filled with a liquid and pouring a liquid over the material or the equipment using, for example, a shower. In this case, the liquid used is preferably cooled in advance, and it may be cooled, for example, by allowing a coolant to flow through a cooling pipe provided in the bath filled with the liquid, or by returning a liquid cooled with a coolant into the bath. For example, the liquid is preferably a lubricant. This is because, if the material is cooled with a lubricant, the wire drawing can be more readily performed. On the other hand, if the equipment is cooled, it may be cooled by allowing a coolant to flow through, for example, a pipe provided in the equipment. Examples of coolants for cooling the liquid or the equipment include hydrofluorocarbons, alcohols, liquid ethylene glycol, and dry ice. For production of other-element-free materials, presumably such a rolling step may be included.

EXAMPLES

Production of Foil

Example 1

Figure 6:
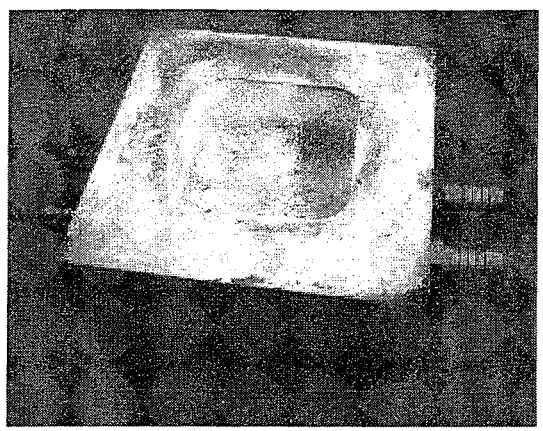
FIG. 6 is a photograph of a mold used in a casting step.

First, a copper-zirconium binary alloy containing 3.0 atomic percent of zirconium with the balance being copper was subjected to levitation melting in an argon gas atmosphere. Next, a pure copper mold having a cavity of 80 mm×80 mm was coated, and the melt of about 1,200° C. was poured and cast into a plate-shaped ingot having a thickness of 3 mm. The thickness of the ingot was determined to be 3 mm by measurement using a micrometer. FIG. 6 is a photograph of the casting mold used in the casting step. Next, rolling was performed by shearing the plate-shaped ingot, which had been cooled to room temperature, at room temperature so that the thickness after the rolling was 0.025 mm, thus producing a foil of Example 1. During the process, the rolling speed was 5 m/min. The thickness of the copper alloy foil was determined to be 0.025 mm by measurement using a micrometer.

Examples 2 to 3

A foil of Example 2 was produced in the same manner as in Example 1 except that rolling was performed so that the thickness after the rolling was 0.015 mm. In addition, a foil of Example 3 was produced in the same manner as in Example 1 except that rolling was performed so that the thickness after the rolling was 0.010 mm.

Examples 4 to 6

A foil of Example 4 was produced in the same manner as in Example 1 except that a copper-zirconium binary alloy containing 4.0 atomic percent of zirconium with the balance being copper was used and that rolling was performed so that the thickness after the rolling was 0.015 mm. In addition, a foil of Example 5 was produced in the same manner as in Example 4 except that rolling was performed so that the thickness after the rolling was 0.010 mm. In addition, a foil of Example 6 was produced in the same manner as in Example 4 except that rolling was performed so that the thickness after the rolling was 0.008 mm.

Examples 7 to 10

A foil of Example 7 was produced in the same manner as in Example 4 except that the melt was poured to a thickness of 5 mm and that rolling was performed so that the thickness after the rolling was 0.050 mm. In addition, a foil of Example 8 was produced in the same manner as in Example 7 except that rolling was performed so that the thickness after the rolling was 0.025 hit. In addition, a foil of Example 9 was produced in the same manner as in Example 7 except that rolling was performed so that the thickness after the rolling was 0.010 mm. In addition, a foil of Example 10 was produced in the same manner as in Example 7 except that rolling was performed so that the thickness after the rolling was 0.008 mm.

Examples 11 to 13

A foil of Example 11 was produced in the same manner as in Example 4 except that the melt was poured to a thickness of 7 mm and that rolling was performed so that the thickness after the rolling was 0.050 mm. In addition, a foil of Example 12 was produced in the same manner as in Example 11 except that rolling was performed so that the thickness after the rolling was 0.025 mm. In addition, a foil of Example 13 was produced in the same manner as in Example 11 except that rolling was performed so that the thickness after the rolling was 0.010 mm.

Examples 14 to 16

A foil of Example 14 was produced in the same manner as in Example 4 except that the melt was poured to a thickness of 10 mm and that rolling was performed so that the thickness after the rolling was 0.050 mm. In addition, a foil of Example 15 was produced in the same manner as in Example 14 except that rolling was performed so that the thickness after the rolling was 0.025 mm. In addition, a foil of Example 16 was produced in the same manner as in Example 14 except that rolling was performed so that the thickness after the rolling was 0.010 mm.

Examples 17 to 20

A foil of Example 17 was produced in the same manner as in Example 7 except that that a copper-zirconium binary alloy containing 5.0 atomic percent of zirconium with the balance being copper was used. In addition, a foil of Example 18 was produced in the same manner as in Example 17 except that rolling was performed so that the thickness after the rolling was 0.025 mm. In addition, a foil of Example 19 was produced in the same manner as in Example 17 except that rolling was performed so that the thickness after the rolling was 0.010 mm. In addition, a foil of Example 20 was produced in the same manner as in Example 17 except that rolling was performed so that the thickness after the rolling was 0.008 mm.

Examples 21 to 23

A foil of Example 21 was produced in the same manner as in Example 7 except that that a copper-zirconium binary alloy containing 6.8 atomic percent of zirconium with the balance being copper was used. In addition, a foil of Example 22 was produced in the same manner as in Example 21 except that rolling was performed so that the thickness after the rolling was 0.025 mm. In addition, a foil of Example 23 was produced in the same manner as in Example 21 except that rolling was performed so that the thickness after the rolling was 0.010 mm.

Comparative Example 1

A foil of Comparative Example 1 was produced in the same manner as in Example 7 except that a copper-zirconium binary alloy containing 2.5 atomic percent of zirconium with the balance being copper was used.

Comparative Example 2

In Comparative Example 2, rolling was performed in the same manner as in Example 7 except that a copper-zirconium binary alloy containing 7.4 atomic percent of zirconium with the balance being copper was used, although the foil was broken during the rolling.

Comparative Example 3

A copper-zirconium binary alloy containing 8.7 atomic percent of zirconium with the balance being copper was subjected to levitation melting and was cast into a plate-shaped ingot by pouring it to have a thickness of 7 mm, although the ingot was cracked during the casting and could not be subjected to the subsequent rolling step.

Comparative Example 4

A foil of Comparative Example 4 was produced in the same manner as in Example 7 except that the melt was poured to a thickness of 12 mm and that rolling was performed so that the thickness after the rolling was 0.600 mm.

Comparative Example 5

A foil of Comparative Example 5 was produced in the same manner as in Example 7 except that the melt was poured to a thickness of 3 mm.

Observation of Casting Structure

Figure 9:
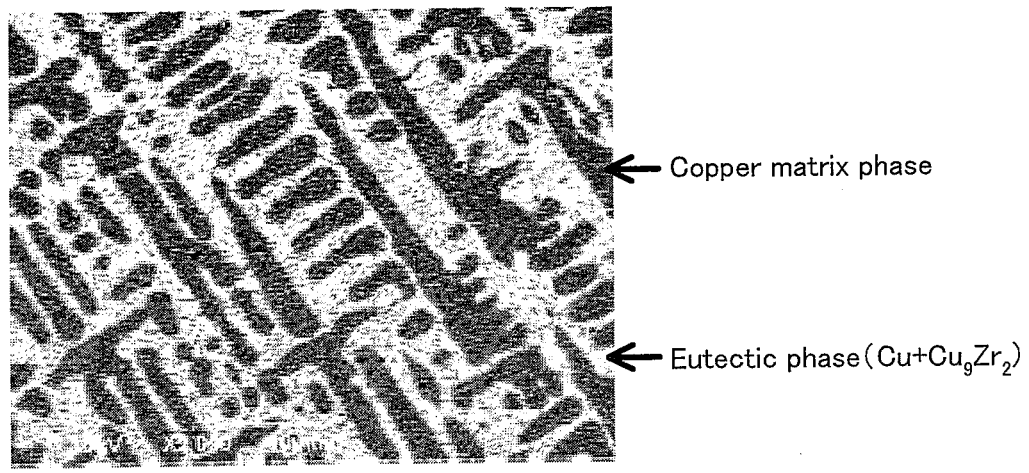
FIG. 9 is an SEM photograph of the casting structure of an ingot containing 4.0 atomic percent of zirconium and having a thickness of 3 mm.

The ingots before the rolling were cut in a cross-section perpendicular to the plate surface, were mirror-polished, and were observed by SEM (SU-70, manufactured by Hitachi, Ltd.). FIG. 9 is an SEM photograph of the casting structure of an ingot containing 4.0 atomic percent of zirconium and having a thickness of 3 mm. The white regions are eutectic phases of copper and $Cu_9Zr_2$, and the black regions are proeutectic copper matrix phases. The secondary DAS was measured using the SEM photographs. Table 1 shows the values of the secondary DAS of Examples 1 to 23 and Comparative Examples 1 to 5. Table 1 shows the secondary DAS, the alloy composition, plate thickness, foil thickness described above, and the rolling reduction, eutectic phase fraction, phase pitch, amorphous fraction, ultimate tensile strength, and electrical conductivity described below.

TABLE 1

| | Melting and Casting Steps | | | Rolling Step | | | | | Foil Property | |
|---|---|---|---|---|---|---|---|---|---|---|
| | | | | | | Eutectic[2] | | | Ultimate | |
| | Alloy Composition at % (Zr) | Plate Thickness mm | Secondary[1] DAS μm | Foil Thickness mm | Rolling Reduction % | Phase Fraction % | Phase[3] Pitch nm | Amorphous[4] Fraction % | Tensile Strength MPa | Electrical[5] Conductivity % IACS |
| Example 1 | 3.0 | 3 | 3.1 | 0.025 | 99.17 | 40 | 50 | 6 | 1320 | 44 |
| Example 2 | 3.0 | 3 | 3.1 | 0.015 | 99.50 | 43 | 50 | 7 | 1350 | 40 |
| Example 3 | 3.0 | 3 | 3.1 | 0.010 | 99.67 | 44 | 50 | 9 | 1420 | 33 |
| Example 4 | 4.0 | 3 | 2.2 | 0.015 | 99.50 | 43 | 40 | 5 | 1300 | 35 |
| Example 5 | 4.0 | 3 | 2.2 | 0.010 | 99.67 | 45 | 30 | 11 | 1410 | 32 |
| Example 6 | 4.0 | 3 | 2.2 | 0.008 | 99.73 | 50 | 20 | 13 | 1600 | 29 |
| Example 7 | 4.0 | 5 | 4.6 | 0.050 | 99.00 | 47 | 40 | 12 | 1420 | 30 |
| Example 8 | 4.0 | 5 | 4.6 | 0.025 | 99.50 | 48 | 30 | 15 | 1550 | 28 |
| Example 9 | 4.0 | 5 | 4.6 | 0.010 | 99.80 | 50 | 30 | 16 | 1770 | 28 |
| Example 10 | 4.0 | 5 | 4.6 | 0.008 | 99.84 | 52 | 20 | 22 | 1800 | 25 |
| Example 11 | 4.0 | 7 | 6.3 | 0.050 | 99.29 | 44 | 50 | 16 | 1330 | 36 |
| Example 12 | 4.0 | 7 | 6.3 | 0.025 | 99.64 | 44 | 50 | 18 | 1420 | 33 |
| Example 13 | 4.0 | 7 | 6.3 | 0.010 | 99.86 | 47 | 40 | 19 | 1630 | 29 |
| Example 14 | 4.0 | 10 | 9.7 | 0.050 | 99.50 | 42 | 50 | 10 | 1350 | 37 |
| Example 15 | 4.0 | 10 | 9.7 | 0.025 | 99.75 | 43 | 40 | 11 | 1400 | 34 |
| Example 16 | 4.0 | 10 | 9.7 | 0.010 | 99.90 | 46 | 40 | 10 | 1420 | 33 |
| Example 17 | 5.0 | 5 | 4.3 | 0.050 | 99.00 | 49 | 50 | 15 | 1550 | 34 |
| Example 18 | 5.0 | 5 | 4.3 | 0.025 | 99.50 | 52 | 30 | 19 | 1660 | 24 |
| Example 19 | 5.0 | 5 | 4.3 | 0.010 | 99.80 | 54 | 20 | 23 | 1750 | 23 |
| Example 20 | 5.0 | 5 | 4.3 | 0.008 | 99.84 | 55 | 20 | 25 | 1790 | 21 |
| Example 21 | 6.8 | 5 | 3.2 | 0.050 | 99.00 | 51 | 50 | 15 | 1610 | 33 |
| Example 22 | 6.8 | 5 | 3.2 | 0.025 | 99.50 | 53 | 40 | 22 | 1780 | 23 |
| Example 23 | 6.8 | 5 | 3.2 | 0.010 | 99.80 | 60 | 30 | 24 | 1800 | 21 |
| Comparative Example 1 | 2.5 | 5 | 9.7 | 0.050 | 99.00 | 33 | 130 | 3 | 1080 | 40 |
| Comparative Example 2 | 7.4 | 5 | 2.3 | 0.050 | Break | — | — | — | — | — |
| Comparative Example 3 | 8.7 | 7 | Crack | — | — | — | — | — | — | — |
| Comparative Example 4 | 4.0 | 12 | 10.9 | 0.600 | 95.00 | 34 | 110 | 4 | 1120 | 39 |
| Comparative Example 5 | 4.0 | 3 | 2.2 | 0.050 | 98.33 | 39 | 100 | 4 | 1090 | 31 |

[1] Secondary dendrite arm spacing
[2] Area fraction of eutectic phase as viewed in a cross-section perpendicular to the width direction
[3] Average of widths of Cu phases and $Cu_9Zr_2$ phases in eutectic phase as viewed in a cross-section perpendicular to the width direction
[4] Area fraction of amorphous region in eutectic phase as viewed in a cross-section perpendicular to the width direction
[5] Proportion relative to electrical conductivity of annealed pure copper, which is defined as 100%

Derivation of Rolling Reduction

The rolling reduction (%) was derived by {(thickness before rolling−thickness after rolling)×100}/(thickness before rolling).

Observation of Structure after Rolling

Figure 10:
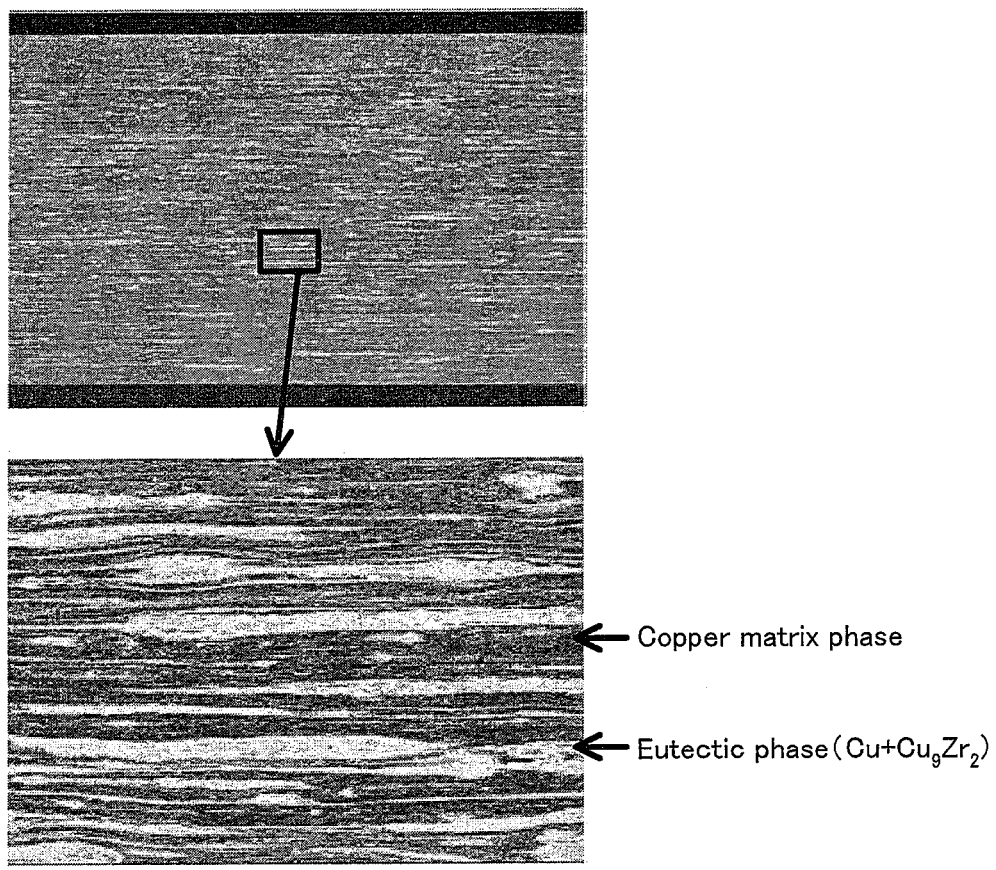
FIG. 10 is a set of SEM photographs of a copper alloy foil of Example 8 in a cross-section perpendicular to the width direction.
Figure 11:
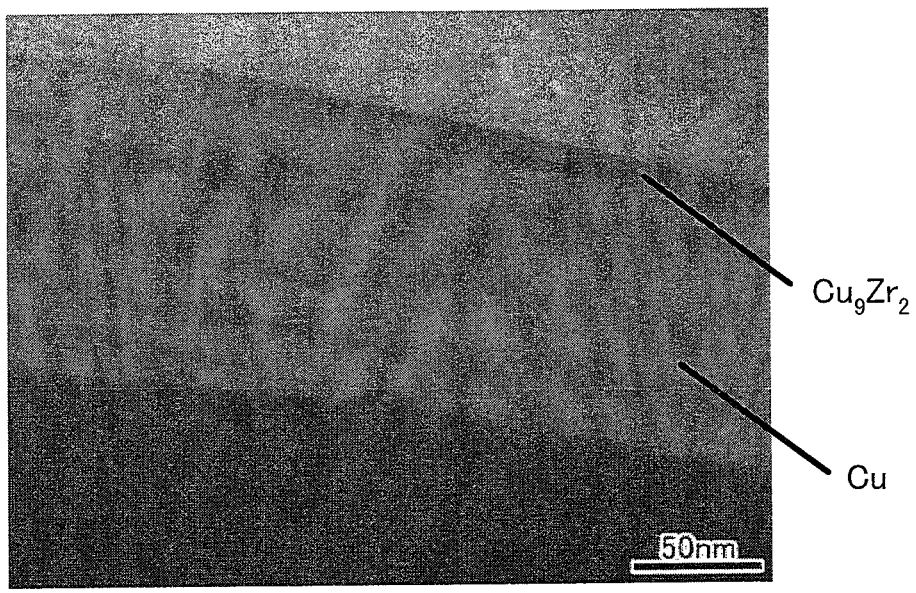
FIG. 11 is an STEM photograph of a eutectic phase in Example 8.
Figure 12:
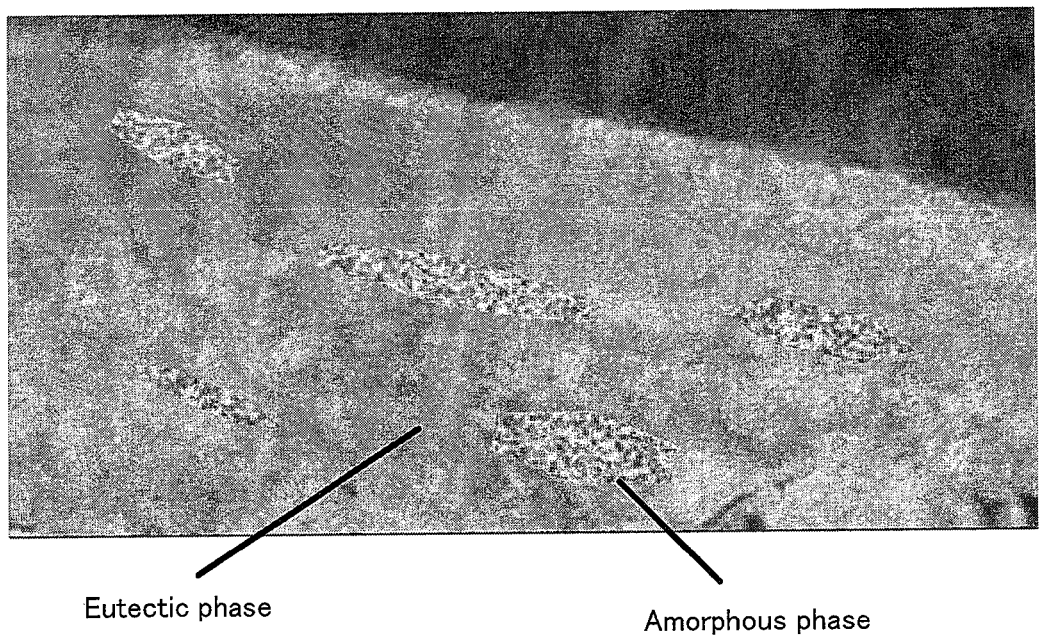
FIG. 12 schematically shows amorphous phases in the eutectic phase.

The copper alloy foils after the rolling were cut in a cross-section located in the center of the width and perpendicular to the width direction, were mirror-polished, and were observed by SEM. FIG. 10 is a set of SEM photographs of a copper alloy foil of Example 8 in a cross-section perpendicular to the width direction. FIG. 10(b) is a magnified view of the region enclosed by the rectangle in the center of FIG. 10(a). The white regions are eutectic phases, and the black regions are copper matrix phases. The black-and-white contrast of the SEM photograph was divided into the copper matrix phases and the eutectic phases by binarization, and the area fraction of the eutectic phases was determined as the eutectic phase fraction. As shown in FIG. 10(b), additionally, the eutectic phases and the copper matrix phases were arranged in a staggered manner to form a layered structure extending in one direction. In this regard, an analysis of the field of view in FIG. 10 by energy dispersive X-ray spectroscopy (EDX) revealed that the black regions were matrix phases formed only of copper and the white regions were eutectic phases containing copper and zirconium. Next, the phase pitch of copper and $Cu_9Zr_2$ was measured by STEM as follows. First, a foil thinned by argon ion milling was prepared as a sample for STEM observation. Then, the central region, serving as a representative region, was observed at a magnification of 500,000 times, and scanning electron microscopy high-angle annular dark-field images (STEM-HAADF images) were acquired in three fields of view of 300 nm×300 nm. The widths of the phases in the STEM-HAADF images were measured, and the average thereof was calculated as the measured phase pitch. FIG. 11 is an STEM photograph, taken by STEM (JEM-2300F, manufactured by JEOL Ltd.), of a white region (eutectic phase) in FIG. 10. An EDX analysis indicated that the white regions were copper and the black regions were $Cu_9Zr_2$. In addition, the presence of $Cu_9Zr_2$ was confirmed by analyzing a diffraction image by selected-area diffraction and measuring the lattice parameters of a plurality of diffraction planes. Thus, it was demonstrated that the eutectic phase in FIG. 11 had a double layered structure in which copper and $Cu_9Zr_2$ were arranged alternately at a substantially regular pitch, namely, about 20 nm. The phase pitch is the pitch of the alternately arranged copper and $Cu_9Zr_2$ measured by STEM observation of the eutectic phases. When the lattice image of the eutectic phase shown in FIG. 11 was observed by STEM at a magnification of 2,500,000 times in a field of view of 50 nm×50 nm, about 15% of amorphous phases were recognized in terms of area fraction in the field of view (eutectic phase). FIG. 12 schematically shows the amorphous phases in the eutectic phase. The amorphous phases were mainly formed at the interfaces between the copper matrix phases and the $Cu_9Zr_2$ compound phases, presumably contributing to maintaining sufficient mechanical strength. The amorphous fraction was determined by measuring the area fraction of possible amorphous regions where atoms were randomly arranged in the lattice image. In addition, when the copper structure in FIG. 11, which looks white, was observed by STEM, the difference in orientation between the adjacent fine crystals was extremely small, namely, about 1° to 2°. This suggests that large shear slip deformation occurred in copper in the rolling direction without aggregation of dislocations. This presumably allows rolling at high rolling ratio without causing a break during the cold working.

Measurement of Ultimate Tensile Strength

The ultimate tensile strength was measured according to JIS Z2201 using a universal testing machine (Autograph AG-1kN, manufactured by Shimadzu Corporation). The ultimate tensile strength of each copper alloy foil was determined by dividing the maximum load by the initial cross-sectional area.

Measurement of Electrical Conductivity

The electrical conductivity of each foil was determined by measuring the electrical resistivity (volume resistivity) of the foil at room temperature according to JIS H0505 using a four-electrode electrical resistivity meter, calculating the ratio of the measured electrical resistivity to the resistivity (1.7241 µΩcm) of annealed pure copper (standard soft copper having an electrical resistivity of 1.7241 µΩcm at 20° C.), and converting it to electrical conductivity (% IACS: International Annealed Copper Standard). The conversion was performed by the following equation: electrical conductivity γ (% IACS)=1.7241/volume resistivity ρ×100.

Experimental Results

As shown in Table 1, when the zirconium content fell below 3.0 atomic percent, the ultimate tensile strength was decreased (Comparative Example 1). The reason is presumably that an amount of eutectic phases large enough to ensure sufficient strength was not formed because the zirconium content was low. On the other hand, when the zirconium content exceeded 7.0 atomic percent, no desired foil could be obtained because a break occurred during the rolling (Comparative Example 2) or a crack occurred during the casting (Comparative Example 3). In addition, even though the zirconium content fell within the range of 3.0 to 7.0 atomic percent, the ultimate tensile strength was decreased when the secondary DAS of the casting structure was excessive (Comparative Example 4) or the rolling reduction fell below 99.00% (Comparative Example 5). This is presumably because an amount of eutectic phases large enough to ensure sufficient strength was not formed. In contrast, Examples 1 to 23 achieved an ultimate tensile strength exceeding 1,300 MPa and an electrical conductivity exceeding 20% IACS without suffering a casting crack or a break during the production. Thus, it was demonstrated that the production method of the present invention provides a desired copper alloy foil by cold working without heat treatment. In addition, it was demonstrated that the casting diameter, the secondary DAS, and the rolling reduction can be appropriately controlled for a particular composition to achieve the desired eutectic phase fraction, the desired phase pitch of copper and $Cu_9Zr_2$ in the eutectic phases, and the desired amorphous fraction, thus achieving an ultimate tensile strength exceeding 1,300, 1,500, or 1,700 MPa and an electrical conductivity exceeding 20% IACS. In particular, it was demonstrated that the ultimate tensile strength becomes higher with increasing zirconium content, increasing eutectic phase fraction, and increasing amorphous fraction. Hence, presumably the copper matrix phases contribute to electrical conductivity as a path for free electrons, whereas the eutectic phases contribute to ultimate tensile strength. In the eutectic phases, additionally, presumably copper contributes to electrical conductivity, whereas the eutectic phases contribute to ultimate tensile strength. It was also demonstrated that a high-strength copper alloy foil having such foil properties can be achieved as-rolled with a thickness of 0.050, 0.025, or 0.010 mm or less.

In the above experiment, the properties of other-element-free materials produced so as to contain as small amounts of elements other than copper and zirconium as possible were examined. To examine the properties of other-element-containing materials produced so as to contain elements other than copper and zirconium, the following experiment was further carried out. The examples below show experimental results of wires, which differ in that they were formed by wire drawing, rather than by rolling; however, presumably similar experimental results are obtained with foils because rolling and wire drawing share the characteristic that they are heavy working.

Example 24

First, an alloy containing 3.0 atomic percent of zirconium and 700 to 2,000 ppm by mass of oxygen with the balance being copper was put into a quartz nozzle having a tap hole in the bottom surface thereof, and after the nozzle was evacuated to $5 \times 10^{-2}$ Pa and was then purged with argon gas to nearly the atmospheric pressure, the alloy was melted into liquid metal in an arc melting furnace while applying a pressure of 0.5 MPa to the liquid surface. Next, a pure copper mold having a round-bar-shaped cavity with a diameter of 3 mm and a length of 60 mm was coated, and the melt of about 1,200° C. was poured and cast into a round-bar ingot. The melt was poured by opening the tap hole formed in the bottom surface of the quartz nozzle while applying pressure with argon gas. Next, the round-bar ingot, which had been cooled to room temperature, was subjected to cold wire drawing to a diameter of 0.5 mm using a cemented carbide die at room temperature and was then subjected to continuous cold wire drawing to a diameter of 0.160 mm using diamond dies, thus producing a wire of Example 24. The continuous wire drawing was performed with the wire and the diamond dies immersed in a bath filled with an aqueous liquid lubricant. During this process, the liquid lubricant in the bath was cooled with a cooling pipe using liquid ethylene glycol as a coolant. The reduction of area at which the 3 mm round-bar ingot was drawn to a diameter of 0.5 mm was 97.2%, and the reduction of area at which the 3 mm round-bar ingot was drawn to a diameter of 0.160 mm was 99.7%.

Example 25

A wire of Example 25 was produced in the same manner as in Example 24 except that wire drawing was performed so that the diameter after the wire drawing was 0.040 mm.

Examples 26 to 30

A wire of Example 26 was produced in the same manner as in Example 24 except that an alloy containing 4.0 atomic percent of zirconium and 700 to 2,000 ppm by mass of oxygen with the balance being copper was used and that wire drawing was performed so that the diameter after the wire drawing was 0.200 mm. In addition, a wire of Example 27 was produced in the same manner as in Example 26 except that wire drawing was performed so that the diameter after the wire drawing was 0.160 mm. In addition, a wire of Example 28 was produced in the same manner as in Example 26 except that wire drawing was performed so that the diameter after the wire drawing was 0.070 mm. In addition, a wire of Example 29 was produced in the same manner as in Example 26 except that wire drawing was performed so that the diameter after the wire drawing was 0.040 mm. In addition, a wire of Example 30 was produced in the same manner as in Example 26 except that wire drawing was performed so that the diameter after the wire drawing was 0.027 mm.

Examples 31 to 32

A wire of Example 31 was produced in the same manner as in Example 24 except that an alloy containing 5.0 atomic percent of zirconium and 700 to 2,000 ppm by mass of oxygen with the balance being copper was used and that wire drawing was performed so that the diameter after the wire drawing was 0.160 mm. In addition, a wire of Example 32 was produced in the same manner as in Example 31 except that wire drawing was performed so that the diameter after the wire drawing was 0.040 mm.

Comparative Example 6

A wire of Comparative Example 6 was produced in the same manner as in Example 26 except that wire drawing was performed so that the diameter after the wire drawing was 0.500 mm.

Derivation of Drawing Ratio

First, the cross-sectional area $A_0$ of each ingot before the wire drawing was determined from the diameter thereof, and the cross-sectional area $A_1$ after the wire drawing was determined from the diameter of the copper alloy wire. From these values, the drawing ratio η represented by the equation $\eta = \ln(A_0/A_1)$ was determined.

Observation of Casting Structure

Figure 13:
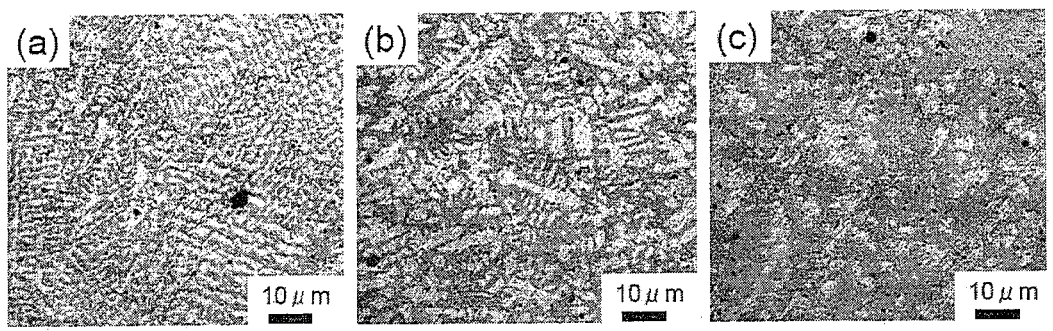
FIG. 13 is a set of optical micrographs of the casting structures of ingots containing 3.0 to 5.0 atomic percent of zirconium.

The ingots before the wire drawing were cut in a circular cross-section perpendicular to the axial direction (hereinafter also referred to as "lateral cross-section"), were mirror-polished, and were observed by optical microscopy. FIG. 13 is a set of optical micrographs of the casting structures of the ingots containing 3.0 to 5.0 atomic percent of zirconium. FIG. 13(a) shows the casting structures of the ingots of Examples 24 and 25 containing 3.0 atomic percent of zirconium, FIG. 13(b) shows the casting structures of the ingots of Examples 26 to 30 containing 4.0 atomic percent of zirconium, and FIG. 13(c) shows the casting structures of the ingots of Examples 31 and 32 containing 5.0 atomic percent of zirconium. The bright regions are proeutectic α-copper phases (copper matrix phases), and the dark regions are eutectic phases (composite phases). FIG. 13 demonstrates that the amount of eutectic phases increases with increasing zirconium content. The secondary DAS was measured using the optical micrographs. In FIG. 13(a), the secondary DAS was 2.7 μm. In FIGS. 13(b) and 13(c), however, the secondary DAS could not be determined because the dendrite arms became nonuniform as the amount of α-copper phases decreased with increasing zirconium content.

Figure 14:
FIG. 14 is an SEM photograph of the casting structure of an ingot containing 3.0 atomic percent of zirconium.

In addition, the ingots before the wire drawing were cut in a circular cross-section perpendicular to the axial direction, were mirror-polished, and were observed by SEM. FIG. 14 is an SEM photograph (composition image) of the casting structures of the ingots of Examples 24 and 25 containing 3.0 atomic percent of zirconium. According to an EDX analysis of the bright and dark regions in the structure, the bright regions contained 93.1 atomic percent of copper and 6.9 atomic percent of zirconium, and the dark regions contained 99.7 atomic percent of copper and 0.3 atomic percent of zirconium. This demonstrates that the bright regions were eutectic phases (composite phases) and the dark regions were α-copper phases (copper matrix phases). Because the solid solubility limit of zirconium in the copper phases is 0.12 atomic percent in the equilibrium diagram of copper-zirconium alloy, the fact that 0.3 atomic percent of zirconium was dissolved in the copper phases of the ingots of the copper alloys containing 3 atomic percent of zirconium suggests that the solid solubility limit of zirconium in the copper phases was extended as a result of solidification by quenching.

Observation of Structure after Wire Drawing

Figure 15:
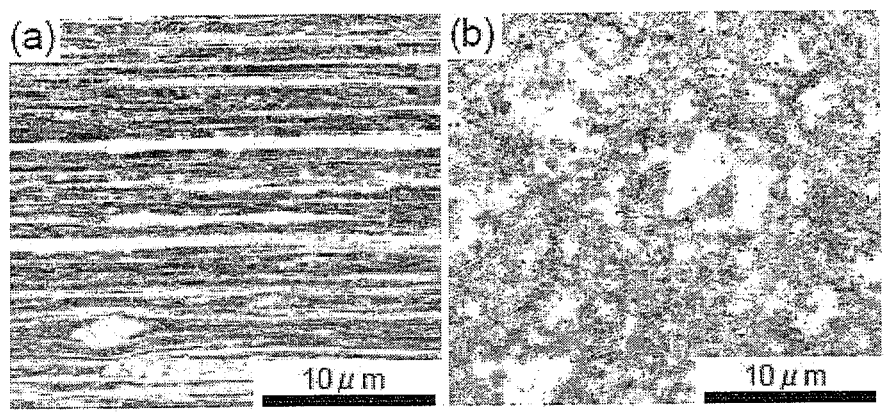
FIG. 15 is a set of SEM photographs of cross-sections of a copper alloy wire of Example 24.
Figure 16:
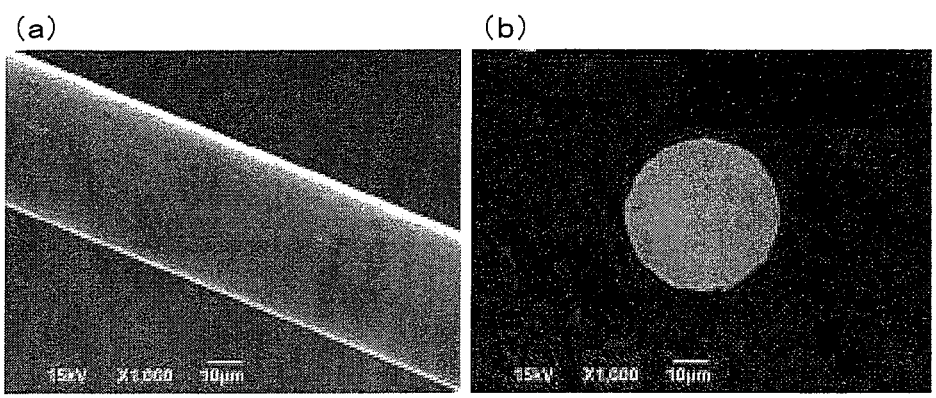
FIG. 16 is a set of SEM photographs of the surface of a copper alloy wire of Example 32.

The copper alloy wires after the wire drawing were cut in a circular cross-section perpendicular to the axial direction (hereinafter referred to as "lateral cross-section") and a cross-section parallel to the axial direction including the central axis (hereinafter also referred to as "longitudinal cross-section"), were mirror-polished, and were observed by SEM. FIG. 15 is a set of SEM photographs (composition images) of the cross-sections of the copper alloy wire of Example 24 (copper alloy containing 3 atomic percent of zirconium; η=5.9). The lateral cross-section was nearly a perfect circle, and no damage, such as a crack, other than scratches formed during the working was observed in the side surface. This demonstrates that high-strain wire drawing can be performed without heat treatment. FIG. 16 is a set of SEM photographs of the surface of the copper alloy wire of Example 32 (copper alloy containing 5 atomic percent of zirconium; =8.6). The surface of the wire was smooth only with some scratches, demonstrating that continuous cold wire drawing can be performed without annealing. In addition, for example, as shown in Table 2, it was demonstrated that wire drawing without heat treatment can be performed at least at a drawing ratio η of 8.6 to a minimum diameter of 40 μm. Furthermore, it was demonstrated that wire drawing without heat treatment can be performed at least at a drawing ratio η of 9.4 to a minimum diameter of 27 μm. As observed in the longitudinal cross-section shown in FIG. 15(*a*), the α-copper phases and the eutectic phases were arranged in a staggered manner to form a fibrous structure extending in one direction (hereinafter also referred to as "layered structure" because a layered structure is observed in the cross section). As observed in the lateral cross-section in FIG. 15(*b*), additionally, the casting structure of the α-copper phases and the eutectic phases of the ingot was broken. In addition, fine particles dispersed in a black spot pattern were observed in the α-copper phases. An EDX analysis of these particles detected oxygen in an amount 4.7 times the amount of oxygen in the eutectic phases as well as copper and zirconium, suggesting the presence of oxide. The bright regions (eutectic phases) and the dark regions (α-copper phases) in the structure in the lateral cross-section in FIG. 15(*b*) were binarized, and the area fraction of the eutectic phases was determined to be 43%. Among the examples where η=5.9, the area fraction of the eutectic phases was 49% in Example 27 (copper alloy containing 4 atomic percent of zirconium) and was 55% in Example 31 (copper alloy containing 5 atomic percent of zirconium). This demonstrates that the area fraction of the eutectic phases increases with the zirconium content.

TABLE 2

| Diameter/mm | 3.0 | 0.5 | 0.2 | 0.16 | 0.07 | 0.04 | 0.027 |
|---|---|---|---|---|---|---|---|
| Reduction of area/% | 0 | 97.2 | 99.6 | 99.7 | 99.9 | 99.99 | 99.99 |
| Drawing ratio, η | 0 | 3.6 | 5.4 | 5.9 | 7.5 | 8.6 | 9.4 |

Figure 17:
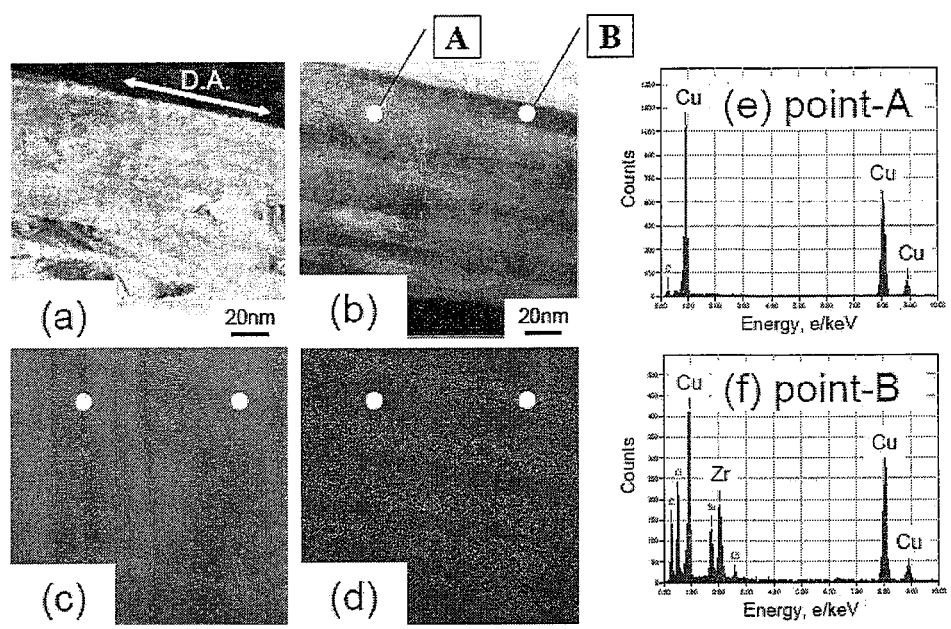
FIG. 17 is a set of STEM photographs of a eutectic phase in a copper alloy wire of Example 27.
Figure 18:
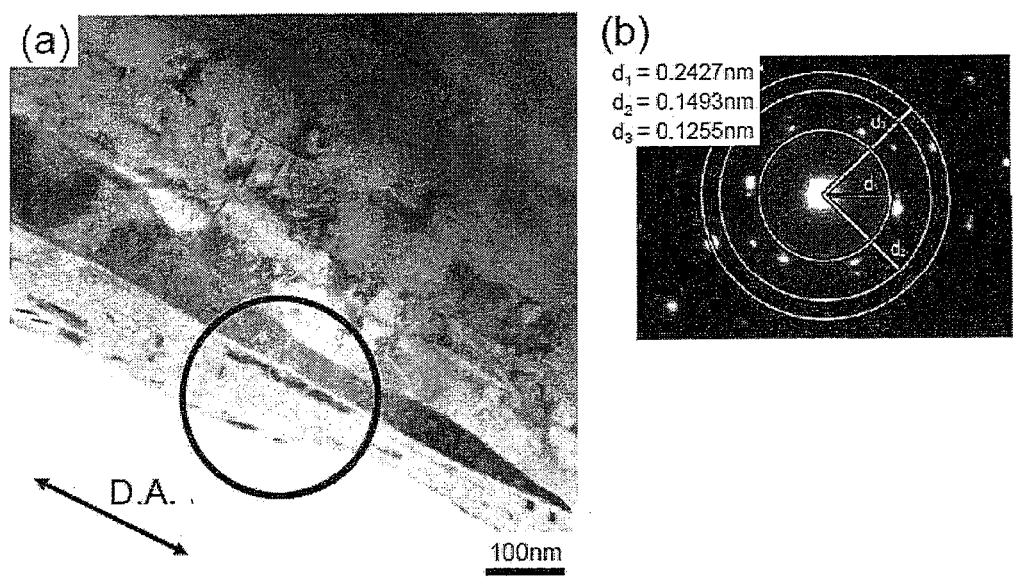
FIG. 18 is a set of STEM photographs of a eutectic phase in the copper alloy wire of Example 27.

FIG. 17 is a set of STEM photographs of a eutectic phase in the copper alloy wire of Example 27 (copper alloy containing 4 atomic percent of zirconium; η=5.9). FIG. 17(*a*) shows a bright-field (BF) image, FIG. 17(*b*) shows a high-angle annular dark-field (HAADF) image, FIG. 17(*c*) shows an elemental map of Cu—Kα, FIG. 17(*d*) shows an elemental map of Zr-Lα, FIG. 17(*e*) shows the results of an elemental analysis at point A in the bright regions in FIG. 17(*b*), and FIG. 17(*f*) shows the results of an elemental analysis at point B in the dark regions in FIG. 17(*b*). The arrow in the BF image indicates the orientation of the drawing axis (DA). In the HAADF image, the bright regions and the dark regions formed a layered structure and were arranged at a pitch of about 20 nm. It was demonstrated that the bright regions were α-copper phases and the dark regions were compound phases containing copper and zirconium. The ratio of the α-copper phases to the compound phases containing copper and zirconium observed in the image was measured to be about 60:40 to 50:50, suggesting that the rule of mixture also applies to the interiors of the eutectic phases. FIG. 18 is a set of STEM photographs of a eutectic phase in the copper alloy wire of Example 27 (copper alloy containing 4 atomic percent of zirconium; η=5.9). FIG. 18(*a*) shows an STEM-BF image, and FIG. 18(*b*) shows a selected-area electron beam diffraction (SAD) image taken from the circle shown in FIG. 18(*a*). In the SAD image in FIG. 18(*b*), ring patterns were observed aside from diffraction spots, which indicate the copper phases. The lattice parameters of the three diffraction rings shown in FIG. 18(*b*) were determined to be $d_1$=0.2427 nm, $d_2$=0.1493 nm, and $d_3$=0.1255 nm, respectively. On the other hand, Table 3 compares the lattice parameters of the (202), (421), and (215) planes of $Cu_9Zr_2$ determined by Glimois et al. The lattice parameters shown above can be assumed to be equivalent to those in Table 3 within the limits of error, suggesting that the compound observed in FIG. 18(*a*) that contained copper and zirconium was $Cu_9Zr_2$.

TABLE 3

| Phase | Pearson symbol | Lattice plane | Lattice parameter (nm) |
|---|---|---|---|
| $Cu_9Zr_2$ | tP24 | (202) | 0.2429 |
| | | (421) | 0.1496 |
| | | (215) | 0.1256 |

Measurement of Ultimate Tensile Strength and Electrical Conductivity

Figure 19:
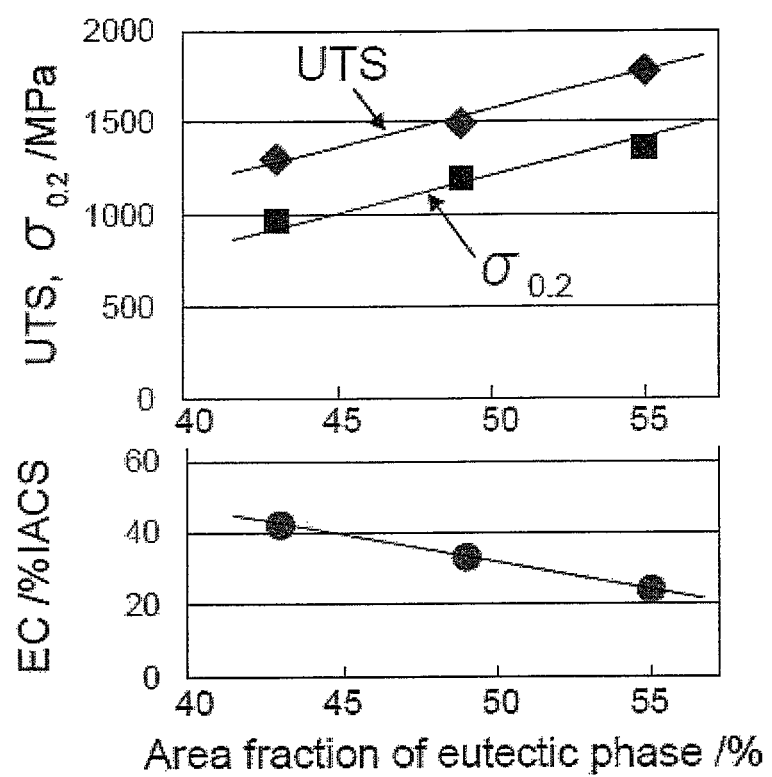
FIG. 19 is a set of graphs showing the relationships between the eutectic phase fraction and the EC, UTS, and $\sigma_{0.2}$ of copper alloy wires drawn at a drawing ratio η of 5.9.

FIG. 19 is a set of graphs showing the relationships between the area fraction of eutectic phases (eutectic phase fraction) and the electrical conductivity (EC), ultimate tensile strength (UTS), and 0.2% offset yield strength ($\sigma_{0.2}$) of the examples where the drawing ratio η was 5.9, namely, Example 24 (copper alloy containing 3 atomic percent of zirconium), Example 27 (copper alloy containing 4 atomic percent of zirconium), and Example 31 (copper alloy containing 5 atomic percent of zirconium). The EC decreased with increasing area fraction of the eutectic phases. Conversely, the UTS and the $\sigma_{0.2}$ both increased with increasing area fraction of the eutectic phases. The decrease in EC is presumably related to the fact that the amount of α-copper phases decreased relatively as the area fraction of the eutectic phases increased, whereas the increases in UTS and $\sigma_{0.2}$ are presumably related to the fact that the amount of $Cu_9Zr_2$ compound phases in the eutectic phases increased relatively as the area fraction of the eutectic phases increased.

Figure 20:
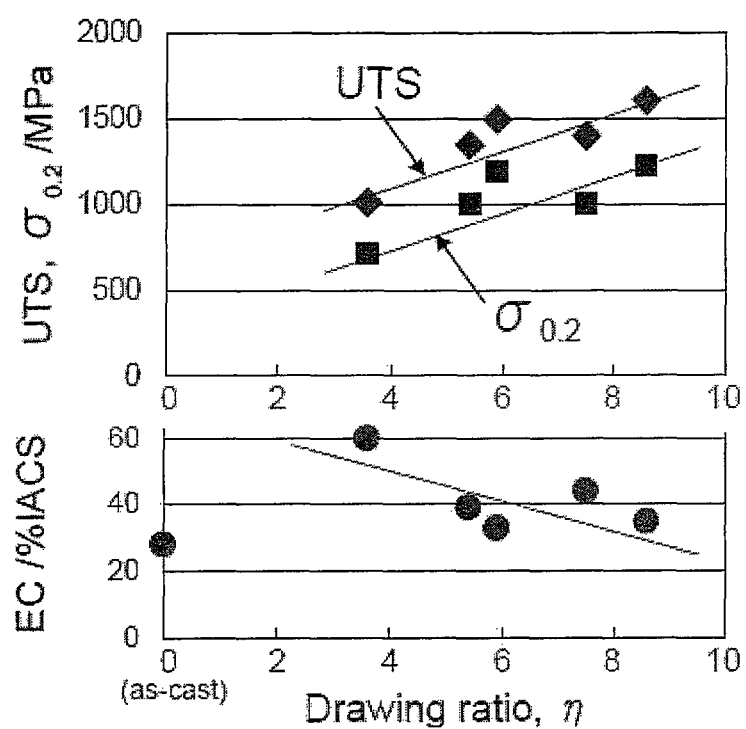
FIG. 20 is a set of graphs showing the relationships between the drawing ratio η and the EC, UTS, and $\sigma_{0.2}$ of copper alloy wires containing 4.0 atomic percent of zirconium.

FIG. 20 is a set of graphs showing the relationships between the drawing ratio η and the EC, UTS, and $a_{0.2}$ of Examples 26 to 30, which are copper alloy wires containing 4.0 atomic percent of zirconium. The EC of the ingots, that is, as-cast, was 28% IACS; the EC of the copper alloy wires after the wire drawing was higher than that of the ingots and was maximized around η=3.6, but decreased at higher drawing ratios. The UTS and the $\sigma_{0.2}$, on the other hand, increased linearly with increasing drawing ratio.

Figure 21:
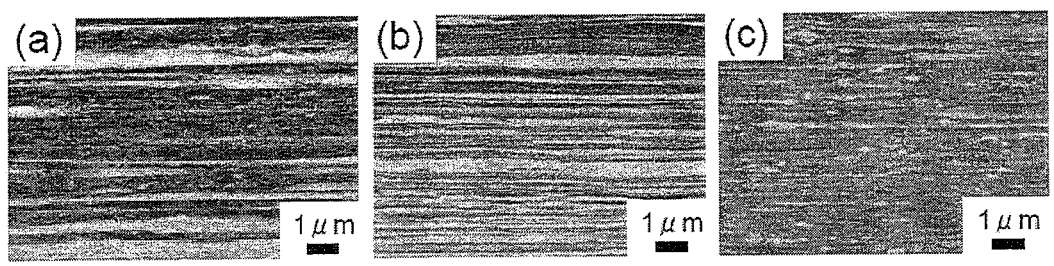
FIG. 21 is a set of SEM photographs of longitudinal cross-sections of the copper alloy wires containing 4.0 atomic percent of zirconium.

FIG. 21 is a set of SEM photographs of longitudinal cross-sections of the copper alloy wires containing 4.0 atomic percent of zirconium, where FIG. 21(*a*) shows Example 27 (η=5.9), FIG. 21(*b*) shows Example 28 (η=7.5), and FIG. 21(*c*) shows Example 29 (η=8.6). It was demonstrated that the layered structure of the α-copper phases and the eutectic phases changes to a denser structure including thinner layers with increasing drawing ratio. This change of the layered structure is presumably related to the relationships between the drawing ratio η and the EC, UTS, and $\sigma_{0.2}$ shown in FIG. 20. Furthermore, presumably the layered structure of the copper phases and the $Cu_9Zr_2$ compound phases formed in the eutectic phases changes with the drawing ratio η and affects the electrical and mechanical properties.

Figure 22:
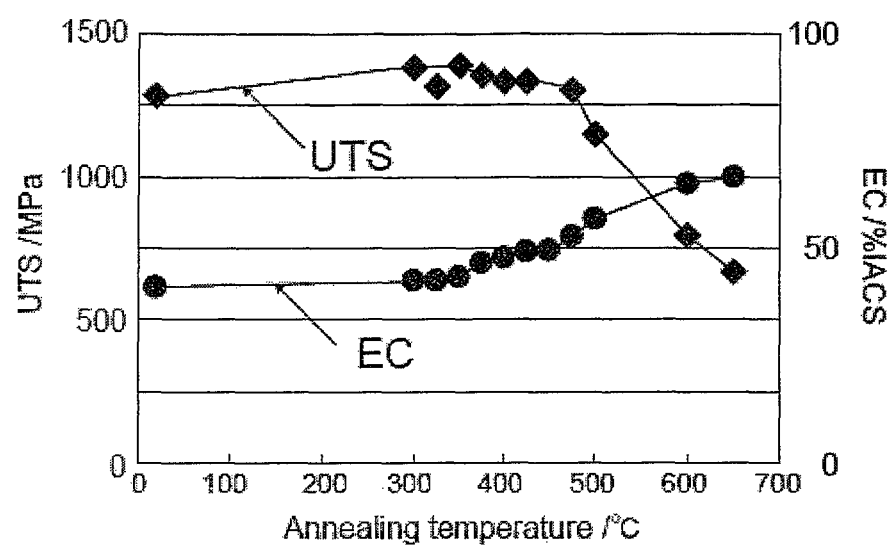
FIG. 22 is a graph showing the relationships between the annealing temperature and the EC and UTS of annealed samples of a copper alloy wire of Example 24.

FIG. 22 is a graph showing the relationships between the annealing temperature and the EC and UTS of annealed samples of the copper alloy wire of Example 24 (copper alloy containing 3 atomic percent of zirconium; η=5.9). The annealing was performed by maintaining the samples at various temperatures within the range of 300° C. to 650° C. for 900 seconds and then cooling them in the furnace. The EC remained nearly the same within the range of room temperature to 300° C., but increased gradually at higher temperatures. The UTS was maximized at 350° C., decreased gradually, and decreased abruptly above 475° C. One possible cause for this is precipitation of zirconium dissolved in the α-copper phases. The electrical and mechanical properties of the drawn wire, which are presumably affected by the structure, were relatively stable up to 475° C., whereas the structure presumably changed at higher temperatures.

Figure 23:
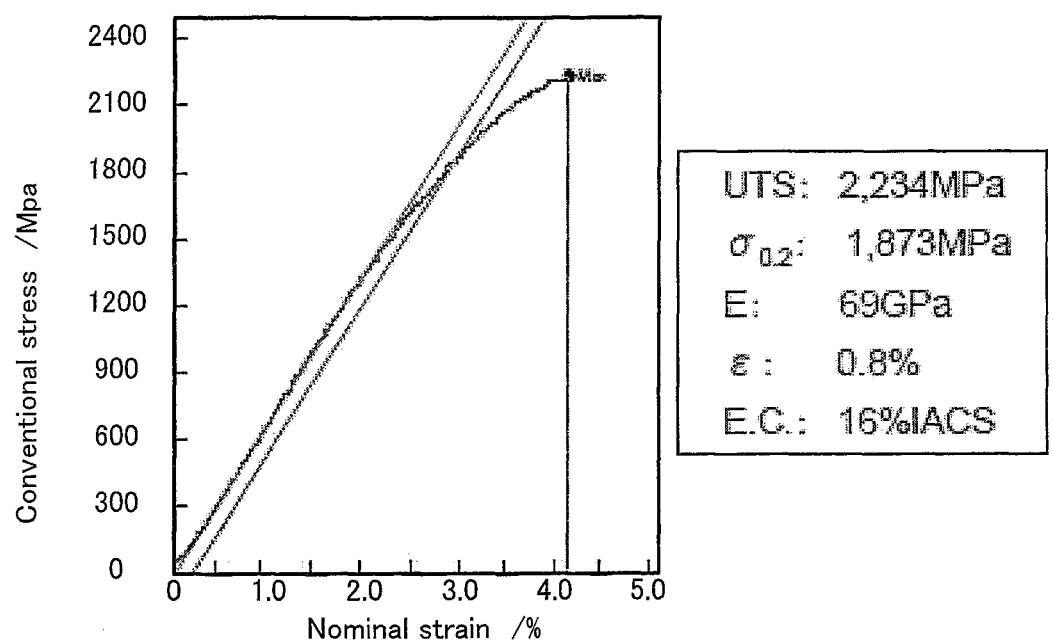
FIG. 23 is a graph showing the nominal S—S curve of the copper alloy wire of Example 32.

FIG. 23 is a graph showing the nominal S—S curve of the copper alloy wire of Example 32 (copper alloy containing 5 atomic percent of zirconium; η=8.6). The ultimate tensile strength was 2,234 MPa, the 0.2% offset yield strength was 1,873 MPa, the Young's modulus was 69 GPa, and the elongation was 0.8%. In addition, the electrical conductivity was 16% IACS. This demonstrates that it is possible to achieve an ultimate tensile strength of 2,200 MPa or more, an electrical conductivity of 15% AICS or more, and a Young's modulus of 60 to 90 GPa or more. In addition, whereas the ultimate tensile strength exceeded 2 GPa, the Young's modulus was about half that of a practical copper alloy, demonstrating that the break elongation is generally high.

Figure 24:
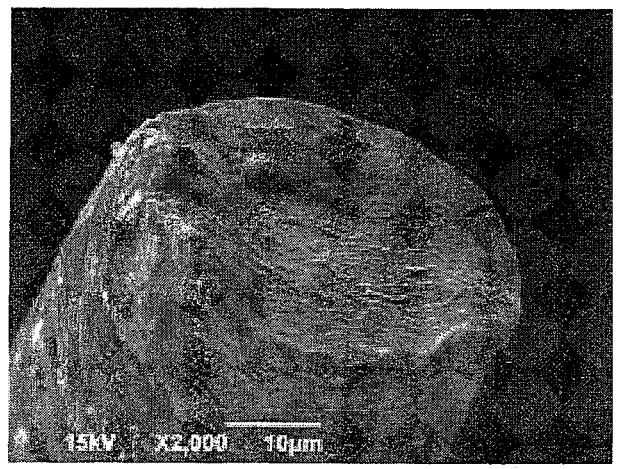
FIG. 24 is an SEM photograph of a fracture surface of the copper alloy wire of Example 32 after a tensile test.

FIG. 24 is an SEM photograph of the fracture surface of the copper alloy wire of Example 32 (copper alloy containing 5 atomic percent of zirconium; η=8.6) after the tensile test. A vein pattern was partially observed, indicating the fracture properties of amorphous alloys.

Figure 25:
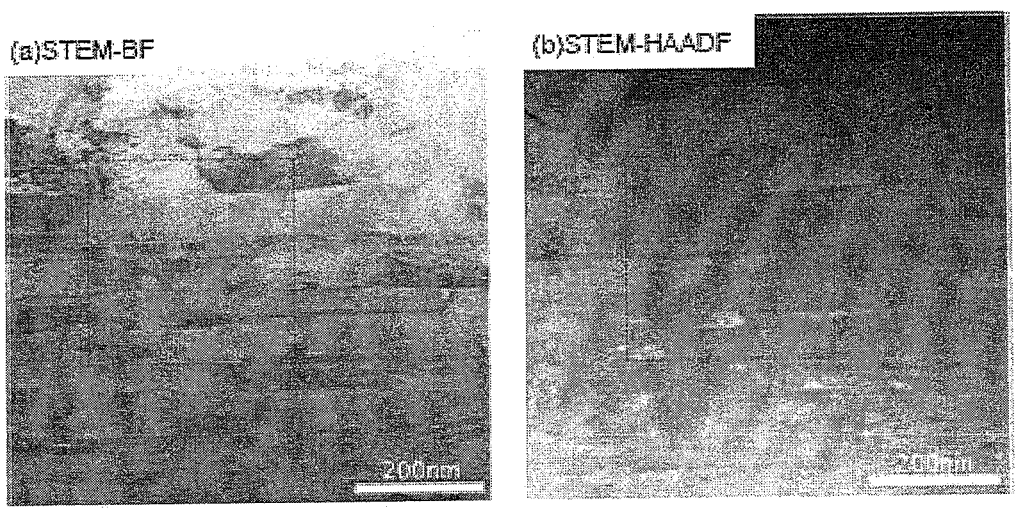
FIG. 25 is a set of STEM photographs of a composite phase in a longitudinal cross-section of the copper alloy wire of Example 29.

FIG. 25 is a set of STEM photographs of a composite phase in a longitudinal cross-section of the copper alloy wire of Example 29 (copper alloy containing 4 atomic percent of zirconium; η=8.6). FIG. 25(a) shows a BF image, and FIG. 25(b) shows an HAADF image. In FIG. 25, layered copper phases having a width of about 10 to 70 nm and $Cu_9Zr_2$ phases extending from the ends thereof in a stringer pattern were observed. The $Cu_9Zr_2$ phases extending in a stringer pattern had an average width of not more than 10 nm, demonstrating that they become thinner (finer) with increasing drawing ratio. Thus, presumably the ultimate tensile strength can be increased, for example, as the copper-zirconium compound phases, such as the $Cu_9Zr_2$ phases, become finer, and particularly, can be further increased if the average width is 10 nm or less. The copper phases, which are easy to recognize in the BF image in FIG. 25(a), are layered regions. The $Cu_9Zr_2$ phases, which are easy to recognize in the HADDF image in FIG. 25(b), are black regions extending in a stringer pattern. In addition, as observed in the BF image in FIG. 25(a), deformation twins also appeared in the copper phases at an angle of about 20° to 40° with respect to the drawing axis.

Table 4 shows the results of a quantitative analysis by the ZAF method on the $Cu_9Zr_2$ phases and the copper phases in the composite phases and the copper matrix phases (α-copper phases) of the copper alloy wire of Example 29 (copper alloy containing 4 atomic percent of zirconium; 8.6). According to Table 4, the $Cu_9Zr_2$ contained oxygen. This oxygen presumably increased the ultimate tensile strength by making the copper alloy more amorphous. On the other hand, no oxygen was contained in the copper matrix phases or the copper phases in the composite phases. In addition, silicon was contained in both the $Cu_9Zr_2$ phases and the copper phases in the composite phases. This silicon was presumably derived from the quartz nozzle. Rather than silicon, presumably aluminum may be contained. For example, presumably aluminum is contained if, for example, an alumina nozzle is used.

TABLE 4

| Phase | | O—K 8 | Si—K 14 | Cu—K 29 | Zr-L 40 | mean Z |
|---|---|---|---|---|---|---|
| Point 1 | $Cu_9Zr_2$ | 26.10 | 3.77 | 57.35 | 12.78 | 24.4 |
| Point 2 | Cu | — | 0.93 | 99.07 | — | 28.9 |
| Point 3 | $Cu_9Zr_2$ | 43.81 | 14.54 | 18.24 | 23.41 | 20.2 |
| Point 4 | Cu | — | 7.90 | 92.10 | — | 27.8 |
| Point 5 | Cu | — | — | 100.00 | — | 29.0 |
| Point 6 | Cu | — | — | 100.00 | — | 29.0 |

Figure 26:
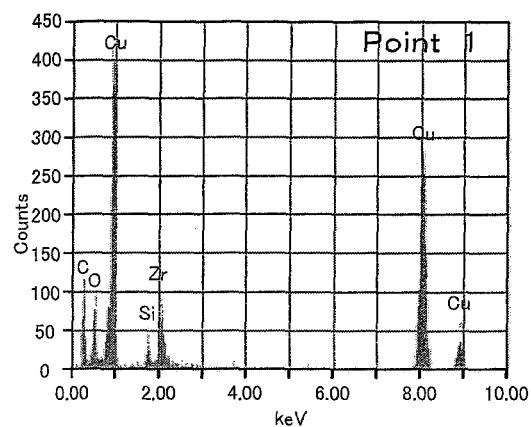
FIG. 26 shows the results of an EDX analysis of a eutectic phase in the copper alloy wire of Example 29.
Figure 26:
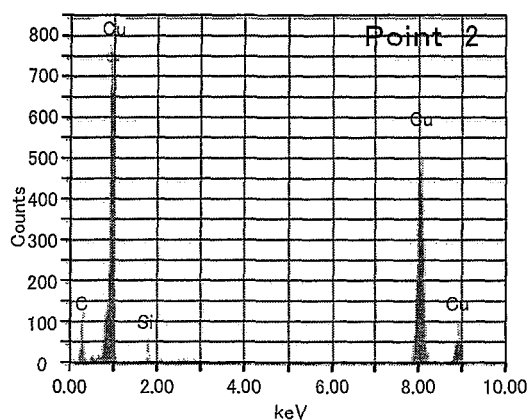
Figure 26:
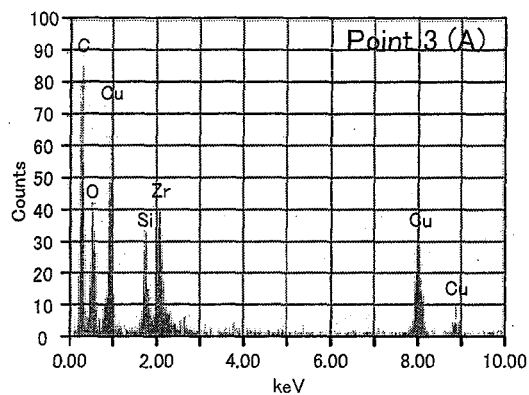
Figure 26:
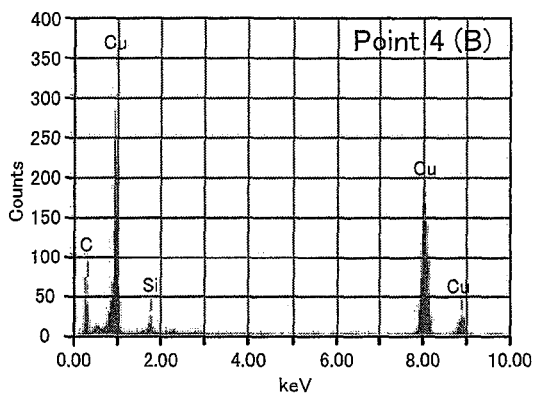
Figure 26:
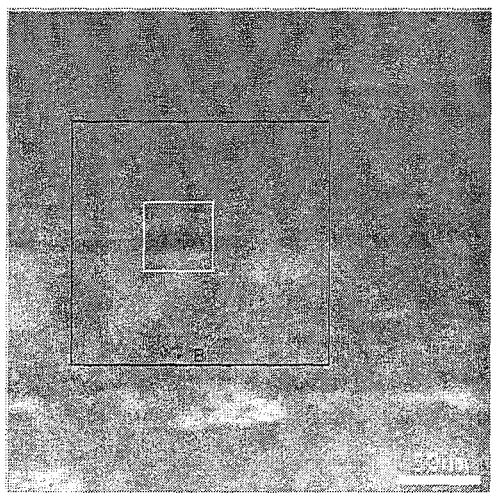
Figure 27:
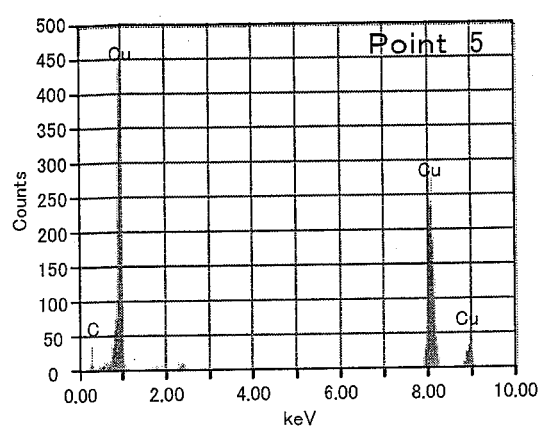
FIG. 27 shows the results of an EDX analysis of a copper matrix phase in the copper alloy wire of Example 29.
Figure 27:
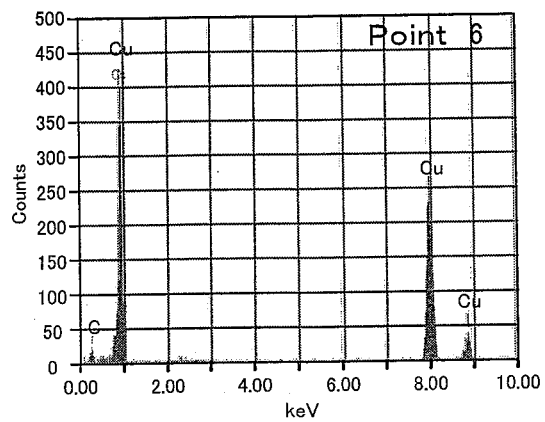
Figure 27:
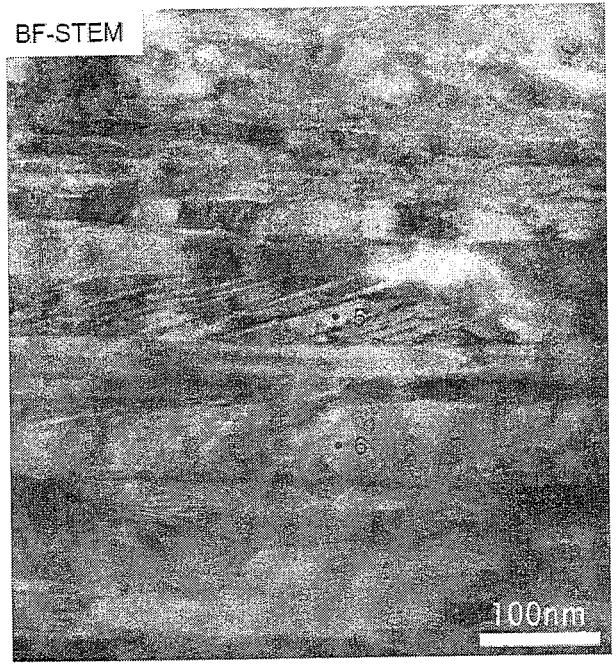

FIG. 26 shows the results of an EDX analysis of a eutectic phase (points 1 to 4) in the copper alloy wire of Example 29 (copper alloy containing 4 atomic percent of zirconium; η=8.6). In addition, FIG. 27 shows the results of an EDX analysis of a copper matrix phase (points 5 and 6) in the copper alloy wire of Example 29. Points 1 to 6 correspond to points 1 to 6, respectively, shown in Table 4. The photograph shown in FIG. 26 is an STEM-HAADF image that is a magnified photograph of the enclosed region in FIG. 25, and points A and B in the STEM-HAADF image correspond to points 3 and 4, respectively. At the points in the $Cu_9Zr_2$ phases, which look dark in the STEM-HAADF image, large amounts of oxygen and silicon were contained, and the mean atomic number Z calculated from the oxygen, silicon, copper, and zirconium concentrations quantified by the ZAF method was 20.2, demonstrating that the mean atomic number Z was apparently lower than that of copper, namely, 29. This is presumably the reason why the $Cu_9Zr_2$ phases look darker than the copper phases. The STEM-HAADF image of the field of view in which the EDX analysis was performed at points 1 and 2 is not shown. On the other hand, the photograph shown in FIG. 27 is an STEM-BF image of a copper matrix phase (α-copper phase), and points 5 and 6 in the STEM-BF image correspond to points 5 and 6, respectively. In the STEM-BF image, a layered structure was found in the α-copper phase, and deformation twins were partially observed therein. The average width of the individual layers, that is, copper phases, in the layered structure was not more than 100 nm. Thus, if a layered structure is formed in the α-copper phases, presumably the ultimate tensile strength can be increased by the effect similar to the Hall-Petch law, and can be further increased if the average width of the copper phases is 100 nm or less. In addition, the deformation twins were formed so as not to straddle the boundaries between the copper phases. These deformation twins were oriented at an angle of 20° to 40° with reference to the axial direction and occupied 0.1% to 5% of the copper matrix phase. If such deformation twins are contained, presumably the ultimate tensile strength can be increased as a result of twinning without significantly decreasing the electrical conductivity. It was confirmed that they were not traces of ion milling. In addition, it was demonstrated that the copper matrix phases contained no oxygen or silicon, or only trace amounts of oxygen and silicon that could not be quantified by the ZAF method. In addition, no sign of formation of dislocation substructures, where the dislocation density is clearly high, was recognized in the α-copper phases or the copper-zirconium compound phases, demonstrating that almost no dislocations were present at least in a longitudinal cross-section. In general, dislocations tend to increase with increasing drawing ratio; in the case of the present application, presumably dislocations increased negligibly because they were absorbed into, for example, the boundaries between the phases or the deformation twins, or disappeared. Accordingly, good electrical conductivity was achieved presumably because almost no dislocations were present in the axial direction. This also applied to other examples, such as those where the zirconium content was 5 atomic percent.

Figure 28:
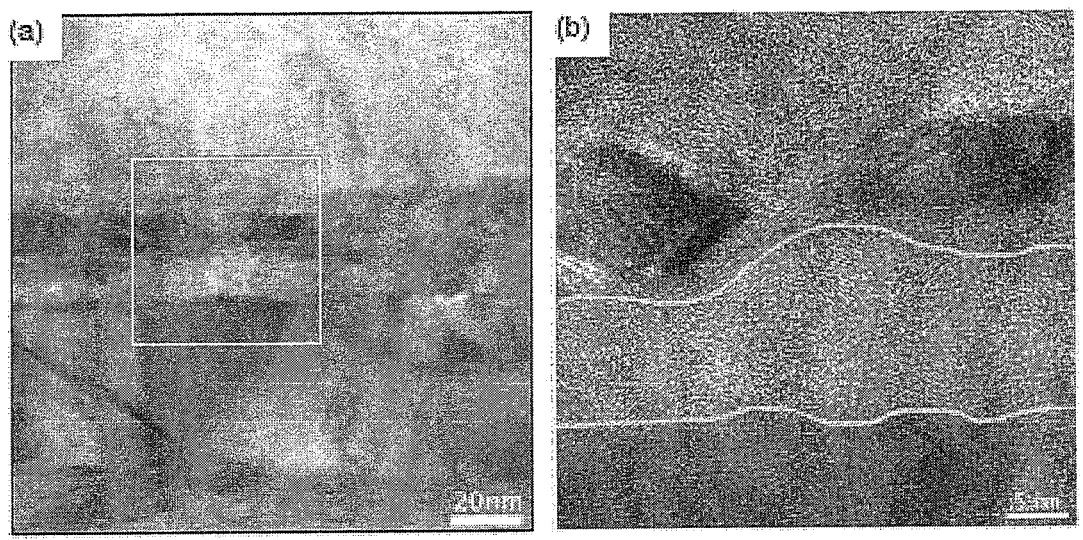
FIG. 28 is a set of STEM-BF images of the copper alloy wire of Example 29.

FIG. 28 is a set of STEM-BF images of the copper alloy wire of Example 29 (copper alloy containing 4 atomic percent of zirconium; η=8.6), showing the results of observations of the enclosed regions in the STEM-HAADF image in FIG. 26. FIG. 28(a) shows an STEM-BF image of the larger frame in FIG. 26, and FIG. 28(b) shows an STEM-BF image of the smaller frame in FIG. 26. Although the copper phases were shaded at some observation sites, lattice fringes were observed. In the $Cu_9Zr_2$ phase enclosed by the solid lines, on the other hand, no lattice fringe was observed, demonstrating that the $Cu_9Zr_2$ phase was amorphous. In FIG. 28, the area fraction of the amorphous phase was determined to be about 31%. This demonstrates that amorphous phases tend to be formed in copper-zirconium compound phases such as $Cu_9Zr_2$ phases. In this regard, presumably the $Cu_9Zr_2$ phases may be amorphous phases in the entirety thereof, rather than in part.

Figure 29:
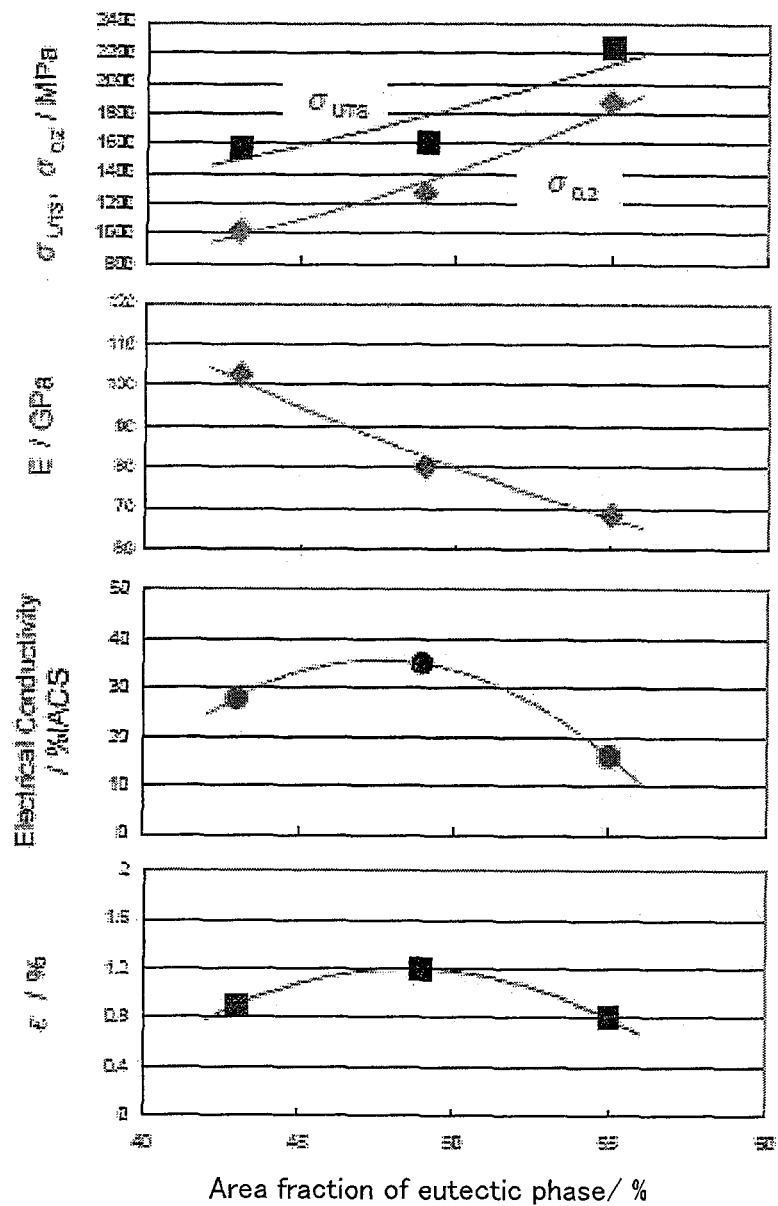
FIG. 29 is a set of graphs showing the relationships between the eutectic phase fraction at a drawing ratio η of 5.9 and the UTS, $\sigma_{0.2}$, Young's modulus, EC, and elongation of copper alloy wires drawn at a drawing ratio η of 8.6.

FIG. 29 is a set of graphs showing the relationships between the eutectic phase fraction measured in a lateral cross-section at a drawing ratio η of 5.9 (intermediate diameter: 160 μm) and the UTS, $\sigma_{0.2}$, Young's modulus, EC, and elongation of the copper alloy wires of the examples where the drawing ratio was 8.6, namely, Example 25 (copper alloy containing 3 atomic percent of zirconium), Example 29 (copper alloy containing 4 atomic percent of zirconium), and Example 32 (copper alloy containing 5 atomic percent of zirconium). It was demonstrated that the UTS and the $\sigma_{0.2}$ increase with increasing eutectic phase fraction. It was also demonstrated that the Young's modulus decreases with increasing eutectic phase fraction. It was also demonstrated that the EC and the elongation are maximized when the eutectic phase fraction is about 50%. The individual properties are presumably related to the presence of the $Cu_9Zr_2$ compound phases and the structural change (becoming more amorphous) in the eutectic phases.

Figure 30:
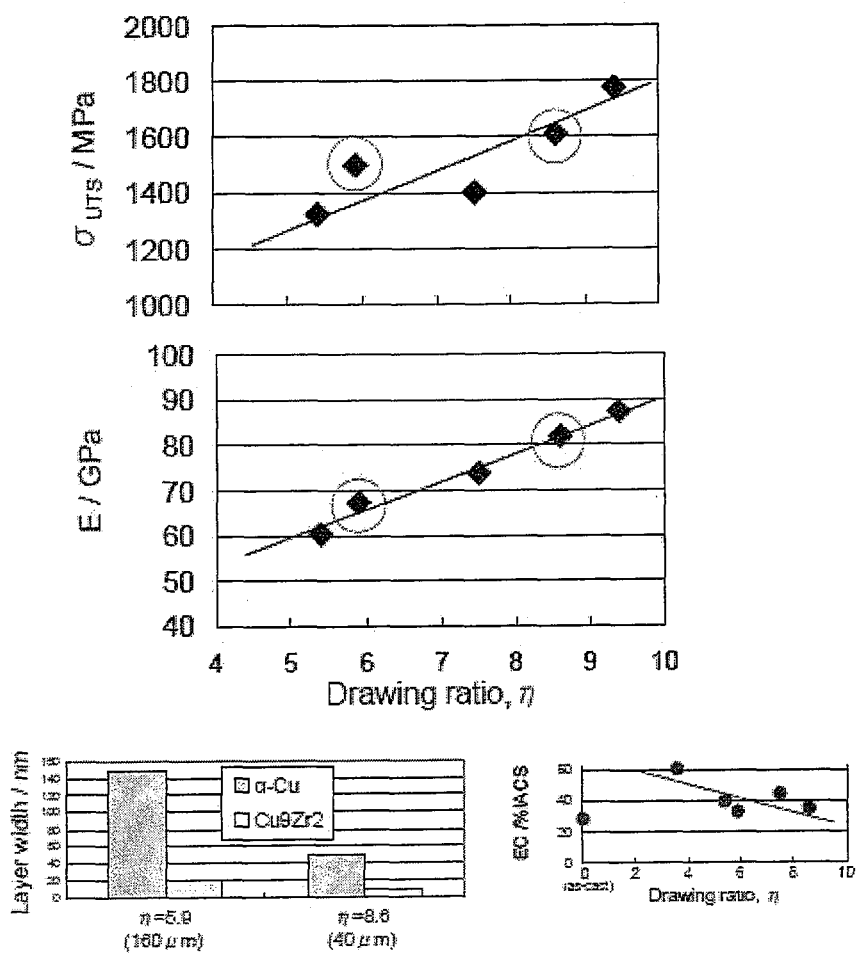
FIG. 30 is a set of graphs showing the relationships between the drawing ratio and the UTS, $\sigma_{0.2}$, structure, and EC of copper alloy wires containing 4.0 atomic percent of zirconium.

FIG. 30 is a set of graphs showing the relationships between the drawing ratio and the UTS, $\sigma_{0.2}$, structure, and EC of the copper alloy wires containing 4 atomic percent of zirconium, namely, Examples 26 to 30. It was demonstrated that the strength and the Young's modulus increase with increasing drawing ratio. In addition, a comparison between the examples where =5.9 and the examples where η=8.6 demonstrates that the average widths of the α-copper phases and the $Cu_9Zr_2$ compound phases decrease with increasing drawing ratio.

Figure 31:
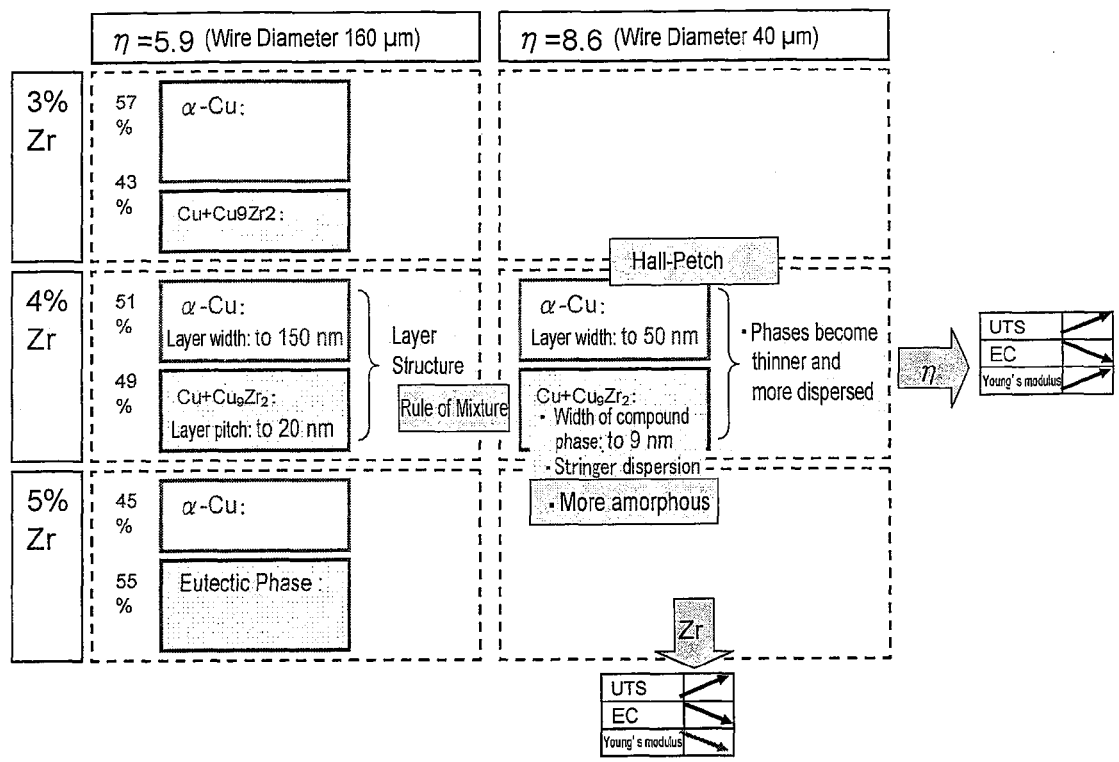
FIG. 31 summarizes the results of examinations of the relationships between the zirconium content and drawing ratio η and the changes in structure and properties.

FIG. 31 summarizes the results of the examinations of the relationships between the zirconium content and drawing ratio η and the changes in layered structure and properties. It was demonstrated that a copper alloy wire drawn at a higher drawing ratio, such as one drawn at a drawing ratio η of 8.6, has a higher ultimate tensile strength. In addition to the improvement in ultimate tensile strength based on the rule of mixture, the following reasons are presumed. For example, presumably the ultimate tensile strength can be increased by the effect similar to the Hall-Petch law because the copper matrix phases are further layered, and can be increased because deformation twins occur in the copper matrix phases. In addition, presumably the ultimate tensile strength can be increased with increasing drawing ratio because, for example, the $Cu_9Zr_2$ compound phases become thinner and more dispersed (stringer dispersion). In addition, the alloy becomes more amorphous with increasing drawing ratio; presumably it enhances the effect of making the alloy more amorphous by the possible presence of oxygen. In addition, presumably the Young's modulus tends to decrease because the alloy tends to become more amorphous as the $Cu_9Zr_2$ phases increase with increasing zirconium content.

Figure 32:
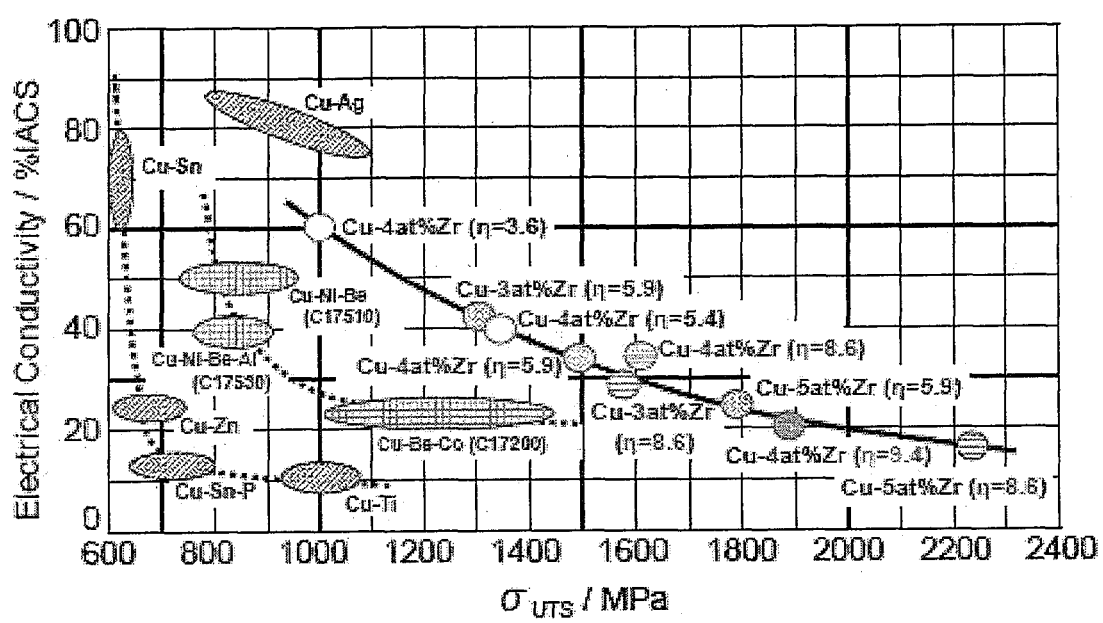
FIG. 32 is a graph showing the relationships between the UTS and EC of the copper alloy wires of Examples 24 to 32 and Comparative Example 6.

Table 5 shows the experimental results of Examples 24 to 32 and Comparative Example 6. Table 5 lists the secondary DAS, the alloy composition, the casting diameter, the drawing diameter, the reduction of area, the drawing ratio, the ultimate tensile strength, and the electrical conductivity. In addition, FIG. 32 is a graph showing the relationships between the UTS and EC of the copper alloy wires of Examples 24 to 32 and Comparative Example 6, together with those of typical known copper alloys for comparison. The results of the copper alloy wires of Examples 24 to 32 and Comparative Example 6 are shown along the solid line. On the other hand, the results of the typical known copper alloys are shown along the broken lines. In general, it is well known that there is a trade-off relationship between UTS and EC: as indicated by the broke lines, the EC decreases shapely with increasing UTS. It was demonstrated, however, that the relationship was gentler for the copper alloy wires of hypoeutectic compositions of Examples 24 to 32 of the present application and Comparative Example 6, as indicated by the solid line, than for the typical known copper alloys. This is because the layered structure could change continuously in association with the drawing ratio (η) during the drawing process, presumably contributing to alleviation of the trade-off relationship between UTS and EC. Whereas a quartz nozzle was used to dissolve the raw material in Examples 24 to 32, presumably the vessel used is not limited thereto and may be a vessel containing quartz. In addition, presumably a vessel containing aluminum may be used. In addition, whereas the molten metal was poured into a copper mold in Examples 1 to 32, presumably it may be directly poured into, for example, a carbon die.

TABLE 5

|  | Melting and Casting Steps | | | Wire Drawing Step | | | Wire Property | |
| --- | --- | --- | --- | --- | --- | --- | --- | --- |
|  | Alloy Composition at % (Zr) | Casting Diameter mm | Secondary [1] DAS μm | Drawing Diameter mm | Reduction of Area % | Drawing [2] Ratio η — | Ultimate Tensile Strength MPa | Electrical [5] Conductivity % IACS |
| Example 24 | 3.0 | 3 | 2.7 | 0.160 | 99.7156 | 5.9 | 1300 | 42 |
| Example 25 | 3.0 | 3 | 2.7 | 0.040 | 99.9822 | 8.6 | 1570 | 29 |

TABLE 5-continued

| | Melting and Casting Steps | | | Wire Drawing Step | | | Wire Property Ultimate | |
|---|---|---|---|---|---|---|---|---|
| | Alloy Composition at % (Zr) | Casting Diameter mm | Secondary [1] DAS μm | Drawing Diameter mm | Reduction of Area % | Drawing [2] Ratio η | Tensile Strength MPa | Electrical [5] Conductivity % IACS |
| Example 26 | 4.0 | 3 | — | 0.200 | 99.5556 | 5.4 | 1330 | 40 |
| Example 27 | 4.0 | 3 | — | 0.160 | 99.7156 | 5.9 | 1500 | 33 |
| Example 28 | 4.0 | 3 | — | 0.070 | 99.9456 | 7.5 | 1400 | 42 |
| Example 29 | 4.0 | 3 | — [4] | 0.040 | 99.9822 | 8.6 | 1610 | 34 |
| Example 30 | 4.0 | 3 | — | 0.027 | 99.9919 | 9.4 | 1890 | 21 |
| Example 31 | 5.0 | 3 | — | 0.160 | 99.7156 | 5.9 | 1800 | 23 |
| Example 32 | 5.0 | 3 | — | 0.040 | 99.9822 | 8.6 | 2220 | 16 |
| Comparative Example 6 | 4.0 | 3 | — | 0.500 | 97.2222 | 3.6 | 1000 | 60 |

[1] Secondary dendrite arm spacing
[2] $\eta = \ln(A_0/A_1)$ $A_0$: cross-sectional area before wire drawing; $A_1$: cross-sectional area after wire drawing
[3] Proportion relative to electrical conductivity of annealed pure copper, which is defined as 100%
[4] Indeterminable Whereas Examples 24 to 32 and Comparative Example 6 are examples of copper alloy wires, presumably similar effects can be achieved with foils, rather than with wires. Specifically, for example, presumably the ultimate tensile strength of a foil can be further increased if the copper-zirconium compound phases have an average width of 10 nm or less. In addition, presumably the ultimate tensile strength of a foil can be further increased if the copper matrix phases have a copper matrix phase inner layered structure including copper phases having an average width of 100 nm or less. In addition, presumably the ultimate tensile strength and electrical conductivity of a foil can be further increased if the copper matrix phases contain deformation twins. In addition, presumably the ultimate tensile strength of a foil can be further increased and the Young's modulus can be controlled to a predetermined range if the copper-zirconium compound phases are represented by $Cu_9Zr_2$ and are amorphous phases in part or the entirety thereof. In addition, presumably the ultimate tensile strength of a copper alloy foil can be further increased if it contains oxygen. In particular, it is presumably preferable that the copper-zirconium compound phases contain oxygen and silicon and have a mean atomic number Z of 20 to less than 29, which is calculated from an elemental composition determined by quantitative measurement of the O—K line, the Si—K line, the Cu—K line, and the Zr-L line using the ZAP method based on EDX analysis. In this case, it is presumably more preferable that the copper matrix phases contain no oxygen. In addition, for example, an ultimate tensile strength in the rolling direction of 2,200 MPa or more, an electrical conductivity of 15% IACS or more, and a Young's modulus of 60 to 90 GPa or more can be achieved with a foil.

Whereas Examples 24 to 32 and Comparative Example 6 are examples of production of copper alloy wires by wire drawing, presumably similar effects can be achieved if rolling, rather than wire drawing, is performed to produce a foil. Specifically, for example, if a foil is produced using a raw material containing 700 to 2,000 ppm by mass of oxygen in the melting step, presumably oxygen can be contained in the copper alloy, thus increasing, for example, the ultimate tensile strength and electrical conductivity of the foil. In addition, if a foil is produced by melting the raw material using a vessel containing silicon or aluminum in the melting step, presumably silicon or aluminum can be contained in the copper alloy, thus increasing the ultimate tensile strength and electrical conductivity of the foil. In addition, if a foil is produced by melting the raw material while injecting an inert gas so as to apply a pressure of 0.5 to 2.0 Pa to the raw material in the melting step, presumably oxygen can be trapped in the copper alloy, thus increasing the ultimate tensile strength and electrical conductivity of the foil. In addition, if a foil is produced by pouring the melt while injecting the inert gas so as to apply a pressure of 0.5 to 2.0 Pa to the raw material in the casting step continuously after the melting step, presumably the ultimate tensile strength and electrical conductivity of the foil can be increased. In addition, if a foil is produced by pouring the metal melted in the melting step into a copper mold or a carbon mold in the casting step, presumably the ultimate tensile strength of the foil can be increased. In addition, if a foil is produced by solidifying the melt in the casting step by quenching so that, according to results of an analysis by the EDX-ZAF method, the amount of zirconium contained in copper matrix phases in the ingot at room temperature after the solidification is supersaturated at 0.3 atomic percent or more, presumably the ultimate tensile strength of the foil can be increased. In addition, if a foil is produced by cold-rolling the ingot to a reduction of area of 99.00% or more through one or more rolling passes including at least one rolling pass having a reduction of area of 15% or more in the rolling step, presumably the ultimate tensile strength of the foil can be further increased. In addition, if a foil is produced by performing the rolling in the rolling step after cooling at least one of the material and equipment for rolling to a temperature lower than room temperature, presumably the ultimate tensile strength of the foil can be further increased.

This application is based on and claims priority from Japanese Patent Application No. 2009-212052 filed on Sep. 14, 2009 and U.S. provisional patent application No. 61/372,185 filed on Aug. 10, 2010, which is hereby incorporated by reference herein in its entirety.

INDUSTRIAL APPLICABILITY

The present invention is applicable in the field of wrought copper products.

The invention claimed is:
1. A copper alloy foil comprising:
copper matrix phases; and
composite phases comprising copper-zirconium compound phases and copper phases;
wherein the zirconium content of the alloy composition is 3.0 to 7.0 atomic percent;

wherein the copper matrix phases and the composite phases form a matrix phase-composite phase layered structure and are arranged alternately parallel to a rolling direction throughout the entire foil as viewed in a cross-section perpendicular to a width direction;

wherein the copper-zirconium compound phases and the copper phases in the composite phases form a composite phase inner layered structure, and the copper matrix phases and the composite phases arranged parallel to the rolling direction are laminated alternately in the thickness direction and the copper-zirconium compound phases and the copper phases are laminated alternately in the thickness direction at a phase thickness of 50 nm or less as viewed in the cross-section;

wherein the composite phases contain 5% to 25% of amorphous phases in terms of area fraction as viewed in the cross-section; and wherein the copper alloy foil contains oxygen in an amount of 700 to 2,000 ppm by mass.

2. A copper alloy foil comprising:
copper matrix phases; and
composite phases comprising copper-zirconium compound phases and copper phases;
wherein the zirconium content of alloy composition is 3.0 to 7.0 atomic percent;
the composite phases contain 5% to 25% of amorphous phases in terms of area fraction as viewed in a cross-section perpendicular to the width direction; and
the copper alloy foil contains oxygen in an amount of 700 to 2,000 ppm by mass.

3. The copper alloy foil according to claim 1, wherein the composite phases occupy 40% to 60% of the copper alloy foil in terms of area fraction as observed in a cross-section perpendicular to the width direction.

4. The copper alloy foil according to claim 1, wherein the copper-zirconium compound phases in the composite phases have an average width of 10 nm or less as viewed in a cross-section perpendicular to the width direction.

5. The copper alloy foil according to claim 1, wherein the copper matrix phases comprise a plurality of copper phases forming a copper matrix phase inner layered structure and having an average width of 100 nm or less in a cross-section perpendicular to the width direction, and contain 0.1% to 5% of deformation twins present at an angle of 20° to 40° with respect to the rolling direction so as not to straddle boundaries between the adjacent copper phases.

6. The copper alloy foil according to claim 1, wherein the copper-zirconium compound phases are represented by the general formula $Cu_9Zr_2$ and are amorphous phases in part or the entirety thereof.

7. The copper alloy foil according to claim 1,
wherein the copper-zirconium compound phases contain oxygen and silicon and have a mean atomic number Z of 20 to less than 29, the mean atomic number Z being calculated from an elemental composition determined by quantitative measurement of the O—K line, the Si—K line, the Cu—K line, and the Zr-L line using the ZAF method based on EDX analysis; and
the copper matrix phases contain no oxygen.

8. The copper alloy foil according to claim 1, wherein the copper alloy foil has an ultimate tensile strength in the rolling direction of 1,300 MPa or more and an electrical conductivity of 20% IACS or more.

9. The copper alloy foil according to claim 1, wherein the copper alloy foil has an ultimate tensile strength in the rolling direction of 2,200 MPa or more, and an electrical conductivity of 15% IACS or more.

10. A flexible printed circuit board comprising the copper alloy foil according to claim 1.

11. A method for producing a copper alloy foil, comprising:
(1) a melting step of melting a raw material so as to prepare a copper alloy containing 3.0 to 7.0 atomic percent of zirconium;
(2) a casting step of casting the melt into an ingot having a secondary dendrite arm spacing (secondary DAS) of 10.0 μm or less; and
(3) a rolling step of cold rolling the ingot to a rolling reduction of 99.00% or more,
wherein the copper alloy foil comprises:
copper matrix phases; and
composite phases comprising copper-zirconium compound phases and copper phases;
wherein the copper matrix phases and the composite phases form a matrix phase-composite phase layered structure and are arranged alternately parallel to a rolling direction throughout the entire foil as viewed in a cross-section perpendicular to a width direction;
wherein the copper-zirconium compound phases and the copper phases in the composite phases form a composite phase inner layered structure, and the copper matrix phases and the composite phases arranged parallel to the rolling direction are laminated alternately in the thickness direction and the copper-zirconium compound phases and the copper phases are laminated alternately in the thickness direction at a phase thickness of 50 nm or less as viewed in the cross-section;
wherein the composite phases contain 5% to 25% of amorphous phases in terms of area fraction as viewed in the cross-section; and
wherein the copper alloy foil contains oxygen in an amount of 700 to 2,000 ppm by mass.

12. The method for producing a copper alloy foil according to claim 11, wherein the melt is cast into a plate-shaped ingot having a thickness of 3 to 10 mm using a copper mold in the casting step.

13. A method for producing a copper alloy foil, comprising:
(1) a melting step of melting a raw material so as to prepare a copper alloy containing 3.0 to 7.0 atomic percent of zirconium;
(2) a casting step of casting the melt into a plate-shaped ingot having a thickness of 3 to 10 mm using a copper mold; and
(3) a rolling step of cold rolling the ingot to a rolling reduction of 99.00% or more,
wherein the copper alloy foil comprises:
copper matrix phases; and
composite phases comprising copper-zirconium compound phases and copper phases;
wherein the composite phases contain 5% to 25% of amorphous phases in terms of area fraction as viewed in a cross-section perpendicular to the width direction; and
the copper alloy foil contains oxygen in an amount of 700 to 2.000 ppm by mass.

14. The method for producing a copper alloy foil according to claim 11, wherein shear rolling is performed in the rolling step.

15. The method for producing a copper alloy foil according to claim 11, wherein the raw material contains 700 to 2,000 ppm by mass of oxygen in the melting step.

16. The method for producing a copper alloy foil according to claim 11, wherein the raw material is melted using a vessel containing silicon or aluminum in the melting step.

17. The method for producing a copper alloy foil according to claim 11,
wherein the raw material is melted while injecting an inert gas so as to apply a pressure of 0.5 to 2.0 MPa to the raw material in the melting step; and
the melt is poured while injecting the inert gas so as to apply a pressure of 0.5 to 2.0 MPa to the raw material in the casting step continuously after the melting step.

18. The method for producing a copper alloy foil according to claim 16, wherein the vessel has a tap hole in a bottom surface thereof.

19. The method for producing a copper alloy foil according to claim 11, wherein the metal melted in the melting step is poured into a copper mold or a carbon mold in the casting step.

20. The method for producing a copper alloy foil according to claim 11, wherein the melt is solidified in the casting step by quenching so that, according to results of an analysis by the EDX-ZAF method, the amount of zirconium contained in copper matrix phases in the ingot at room temperature after the solidification is supersaturated at 0.3 atomic percent or more.

21. The method for producing a copper alloy foil according to claim 11, wherein the ingot is cold-rolled to a reduction of area of 99.00% or more through one or more rolling passes in the rolling step, at least one of the rolling passes having a reduction of area of 15% or more.

22. The method for producing a copper alloy foil according to claim 11, wherein the rolling is performed in the rolling step after cooling at least one of the material and equipment for rolling to a temperature lower than room temperature.

* * * * *